(12) United States Patent
Kossel et al.

(10) Patent No.: US 11,811,418 B2
(45) Date of Patent: Nov. 7, 2023

(54) ANALOG-TO-DIGITAL CONVERTER CIRCUIT WITH A NESTED LOOK UP TABLE

(71) Applicant: INTERNATIONAL BUSINESS MACHINES CORPORATION, Armonk, NY (US)

(72) Inventors: Marcel A. Kossel, Reichenburg (CH); Pier Andrea Francese, Adliswil (CH); Abdullah Serdar Yonar, Zurich (CH); Mridula Prathapan, Adliswil (CH); Thomas Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 17/652,957

(22) Filed: Mar. 1, 2022

(65) Prior Publication Data
US 2023/0283288 A1 Sep. 7, 2023

(51) Int. Cl.
*H03M 1/12* (2006.01)
*H04B 1/16* (2006.01)

(52) U.S. Cl.
CPC ........... *H03M 1/124* (2013.01); *H03M 1/121* (2013.01); *H04B 1/16* (2013.01)

(58) Field of Classification Search
CPC .................................................... H03M 1/124
USPC ....................................................... 375/340
See application file for complete search history.

(56) References Cited

U.S. PATENT DOCUMENTS

| 8,325,076 B2 | 12/2012 | Yousif et al. |
| 8,786,472 B1 * | 7/2014 | Prince ..................... H03M 5/02 341/123 |
| 8,970,419 B2 | 3/2015 | Farley |
| 9,503,115 B1 | 11/2016 | Jaewook |
| 9,831,888 B1 * | 11/2017 | Waltari ............... H03M 1/0624 |
| 2006/0161614 A1 | 7/2006 | Vashishta |
| 2007/0009066 A1 * | 1/2007 | Fredriksson .......... H04L 7/0338 375/326 |
| 2012/0013493 A1 * | 1/2012 | Kato ................... H03M 1/0619 327/276 |

(Continued)

OTHER PUBLICATIONS

Baert et al., "A 5-GS/s 7.2-ENOB Time-Interleaved VCO-Based ADC Achieving 30.5 fJ/cs," IEEE Journal of Solid-State Circuits, vol. 55, Issue 6, Jun. 2020, pp. 1577-1587. <https://ieeexplore.ieee.org/stamp/stamp.jsp?tp=&arnumber=8946584>.

(Continued)

*Primary Examiner* — Lihong Yu
(74) *Attorney, Agent, or Firm* — Grant McNeilly

(57) ABSTRACT

Disclosed herein is an analog-to-digital converter circuit configured for digitizing an analog input signal. The analog-to-digital converter comprises an analog input configured for receiving the analog input signal. The analog-to-digital converter circuit further comprises at least one sub-ADC connected to the analog input signal, wherein the at least one sub-ADC is configured to output at least one encoded output vector in response to receiving the analog input signal. The analog-to-digital converter circuit further comprises a lookup circuit comprising a nested lookup table. The lookup circuit is configured to select an output value from the nested lookup table using the at least one encoded output vector, wherein the lookup circuit is configured to provide the output value as the digitization of the analog input signal.

20 Claims, 36 Drawing Sheets

(56) References Cited

U.S. PATENT DOCUMENTS

2020/0059239 A1* 2/2020 Deutscher ............. H03M 1/164
2020/0119835 A1* 4/2020 Etezadi .................. H04L 27/38
2022/0069852 A1* 3/2022 Harada ................ H04B 1/0092

OTHER PUBLICATIONS

Bernard, et al., "Adaptive LUT-based system for in situ ADC auto-correction." Published Jul. 2010 by Research Gate. 7 pages. DOI:10.1109/IMS3TW.2010.5502995.

Chandrasekaran et al., "A Digital PLL Based 2nd-Order ΔΣ Bandpass Time-Interleaved ADC," 2018 IEEE 61st International Midwest Symposium on Circuits and Systems (MWSCAS), Aug. 5-8, 2018, pp. 286-289. <https://eeexplore.ieee.org/document/8623928>.

Cheng et al., "A Time-to-Digital Converter Using Multi-Phase-Sampling and Time Amplifier for All Digital Phase—Locked Loop," IEEE, Jan. 2010, pp. 285-288. <https://www.researchgate.net/publication/232650181>.

Hassan et al., "A 1 GS/s 6-bit Time-Based Analog-to-Digital Converter (T-ADC) for Front-End Receivers," 2017 IEEE 60th International Midwest Symposium on Circuits and Systems (MWSCAS), Aug. 6-9, 2017, pp. 1605-1608. <https://ieeexplore.ieee.org/document/8053245>.

Kalcher, "Time-based ADCs' by Michael Kalcher," TU Graz, Jan. 14, 2016, 21 pages. <http://workinprogress.abstractimpact.net/Time-Based%20ADCs.pdf>.

Kim et al., "A Time-Based Analog-to-Digital Converter Using a Multi-Phase Voltage-Controlled Oscillator," 2006 IEEE International Symposium on Circuits and Systems (ISCAS), May 21-24, 2006, pp. 3934-3937. <https://ieeexplore.ieee.org/document/1693489>.

Lyu et al., "A 4-GS/s 39.9 dB SNDR 11.7-mW Hybrid Voltage-Time Two-Step ADC With Feedforward Ring Oscillator—Based TDCs," IEEE Journal of Solid-State Circuits, vol. 55, Issue 7, Jul. 2020, pp. 1807-1818. <https://ieeexplore.ieee.org/stamp/stamp.jsp?tp=&arnumber=9082177>.

Miyahara, et al., "22.6 A 2.2GS/s 7b 27.4mW time-based folding-flash ADC with resistively averaged voltage-to-time amplifiers." Published Feb. 9, 2014 by IEEE. 3 pages. In 2014 IEEE International Solid-State Circuits Conference Digest of Technical Papers (ISSCC), pp. 388-389. doi: 10.1109/ISSCC.2014.6757482.

Miyashita et al., "A -104 dBc/Hz In-Band Phase Noise 3 GHz All Digital PLL with Phase Interpolation Based Hierarchical Time to Digital Converter," Jun. 2012, IEICE Transactions on Electronics, vol. E95-C, No. 6, 1 page. <https://www.researchgate.net/publication/252029936_A_-104_dBcHz_In-Band_Phase Noise_3_GHz_All_Digital_PLL_with_Phase Interpolation_Based_Hierarchical_Time_to_Digital_Converter>.

Naraghi, "Time-Based Analog to Digital Converters," University of Michigan, 2009, 118 pages. <https://deepblue.lib.umich.edu/bitstream/handle/2027.42/64787/naraghi_1.pdf?sequence=1>.

Sall, et al., "A study of digital decoders in flash analog-to-digital converters." Published Sep. 3, 2004 by IEEE. 4 pages. In 2004 IEEE International Symposium on Circuits and Systems (IEEE Cat. No.04CH37512). DOI: 10.1109/ISCAS.2004.1328148.

Shao et al., "A low jitter, low spur multiphase phase-locked loop for an IR-UWB receiver," Journal of Semiconductors, vol. 31, No. 8, Aug. 2010, 6 pages. <https://www.researchgate.net/publication/231099535>.

Sinha, Sayantan. "Implementation of an 8-bit ADC using successive subtraction technique." Published Sep. 14, 2017 by EEE. 4 pages. In IEEE Instrumentation & Measurement Magazine ( vol. 20, Issue: 5 ). DOI: 10.1109/MIM.2017.8036696.

Straayer, "Fundamentals of Time-Based Circuits," Maxim Integrated, 2017, 76 pages. <http://site.ieee.org/scv-sscs/files/2017/08/TimeBased_Maxim_ALL_pdf>.

Yang et al., "An 8-bit 2.8 GS/s Flash ADC with Time-based Offset Calibration and Interpolation in 65 nm CMOS," ESSCIRC 2019—IEEE 45th European Solid State Circuits Conference (ESSCIRC), Sep. 23-26, 2019, pp. 305-308. <https://ieeexplore.ieee.org/stamp/stamp.jsp?tp=&arnumber=8902814>.

Yang, Xi. "Flash analog-to-digital converters with time-based techniques." Published Sep. 2019 by MIT Libraries. 116 pages. https://dspace.mit.edu/handle/1721.1/124097.

Yenduri et al., "A Low-Power Compressive Sampling Time-Based Analog-to-Digital Converter," IEEE Journal on Emerging and Selected Topics in Circuits and Systems, vol. 2, Issue 3, Sep. 2012, pp. 502-515. <https://ieeexplore.ieee.org/document/6341093>.

Yi et al., "A 15.1-mW 6-GS/s 6-bit Single-Channel Flash ADC With Selectively Activated 8× Time-Domain Latch Interpolation," IEEE Journal of Solid-State Circuits vol. 56, Issue 2, Feb. 2021, pp. 455-464. <https://ieeexplore.ieee.org/stamp/stamp.jsp?tp=&arnumber=9179766>.

Yi et al., "A 4-GS/s 11.3-mW 7-bit Time-Based ADC With Folding Voltage-to-Time Converter and Pipelined TDC in 65-nm CMOS," IEEE Journal of Solid-State Circuits, vol. 56, Issue 2, Feb. 2021, pp. 465-475. <https://ieeexplore.ieee.org/stamp/stamp.jsp?tp=&arnumber=9212427>.

Zhang et al., "An 8-Bit 10-GS/s 16×Interpolation-Based Time-Domain ADC With<1.5-ps Uncalibrated Quantization Steps," IEEE Journal of Solid-State Circuits, vol. 55, Issue 12, Dec. 2020, pp. 3225-3235. <https://ieeexplore.ieee.org/stamp/stamp.jsp?tp=&arnumber=9165099>.

List of IBM Patents or Patent Applications Treated as Related, Mar. 1, 2022, 2 pgs.

Kossell, et al., "Sampling Circuit With a Hierarchial Time Step Generator," U.S. Appl. No. 17/652,960, filed Mar. 1, 2022.

* cited by examiner

Fig. 11(continued)  Example: col addr 29

Fig. 11(continued)

| Coarse address (columns) | | 1 2 3 4 5 6 7 N<0> | 8 9 10 11 12 13 14 15 N<1> | 16 17 18 19 20 21 22 23 N<2> | 24 25 26 27 28 29 30 31 N<3> |
|---|---|---|---|---|---|
| P<7> | 63 62 61 60 59 58 57 56 | 48+[0 to +15] sign: +1 | 40+[0 to +15] sign: +1 | 32+[0 to +15] sign: +1 | 24+[0 to +15] sign: +1 |
| P<6> | 55 54 53 52 51 50 49 48 | 40+[0 to +15] sign: +1 | 32+[0 to +15] sign: +1 | 24+[0 to +15] sign: +1 | 16+[0 to +15] sign: +1 |
| P<5> | 47 46 45 44 43 42 41 40 | 32+[0 to +15] sign: +1 | 24+[0 to +15] sign: +1 | 16+[0 to +15] sign: +1 | 8+[0 to +15] sign: +1 |
| P<4> | 39 38 37 36 35 34 33 32 | 24+[0 to +15] sign: +1 | 16+[0 to +15] sign: +1 | 8+[0 to +15] sign: +1 | 0+[0 to +15] sign: +1 |
| P<3> | 31 30 29 28 27 26 25 24 | 16+[0 to +15] sign: +1 | 8+[0 to +15] sign: +1 | 0+[0 to +15] sign: +1 | [-7 to 7] |
| P<2> | 23 22 21 20 19 18 17 16 | 8+[0 to +15] sign: +1 | 0+[0 to +15] sign: +1 | [-7 to 7] | 0+[0 to +15] sign: -1 |
| P<1> | 15 14 13 12 11 10 9 8 | 0+[0 to +15] sign: +1 | [-7 to 7] | 0+[0 to +15] sign: -1 | 8+[0 to +15] sign: -1 |
| P<0> | 7 6 5 4 3 2 1 0 | [-7 to 7] | 0+[0 to +15] sign: -1 | 8+[0 to +15] sign: -1 | 16+[0 to +15] sign: -1 |

Fig. 12

Smallest value of 8x8 square — Range to be added to smallest value

| 16+[0 to +15] sign: +1 | 8+[0 to +15] sign: +1 | 0+[0 to +15] sign: +1 | [-7 to 7] |
|---|---|---|---|
| 8+[0 to +15] sign: +1 | 0+[0 to +15] sign: +1 | [-7 to 7] | 0+[0 to +15] sign: -1 |
| 0+[0 to +15] sign: +1 | [-7 to 7] | 0+[0 to +15] sign: -1 | 8+[0 to +15] sign: -1 |
| [-7 to 7] | 0+[0 to +15] sign: -1 | 8+[0 to +15] sign: -1 | 16+[0 to +15] sign: -1 |
| 0+[0 to +15] sign: -1 | 8+[0 to +15] sign: -1 | 16+[0 to +15] sign: -1 | 24+[0 to +15] sign: -1 |
| 8+[0 to +15] sign: -1 | 16+[0 to +15] sign: -1 | 24+[0 to +15] sign: -1 | 32+[0 to +15] sign: -1 |
| 16+[0 to +15] sign: -1 | 24+[0 to +15] sign: -1 | 32+[0 to +15] sign: -1 | 40+[0 to +15] sign: -1 |
| 24+[0 to +15] sign: -1 | 32+[0 to +15] sign: -1 | 40+[0 to +15] sign: -1 | 48+[0 to +15] sign: -1 |

32 33 34 35 36 37 38 39 | 40 41 42 43 44 45 46 47 | 48 49 50 51 52 53 54 55 | 56 57 58 59 60 61 62 63
N<4> | N<5> | N<6> | N<7>

Coarse address (columns)

Fig. 12 (continued)

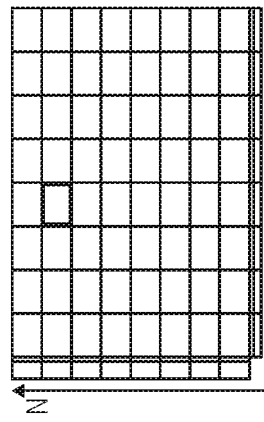
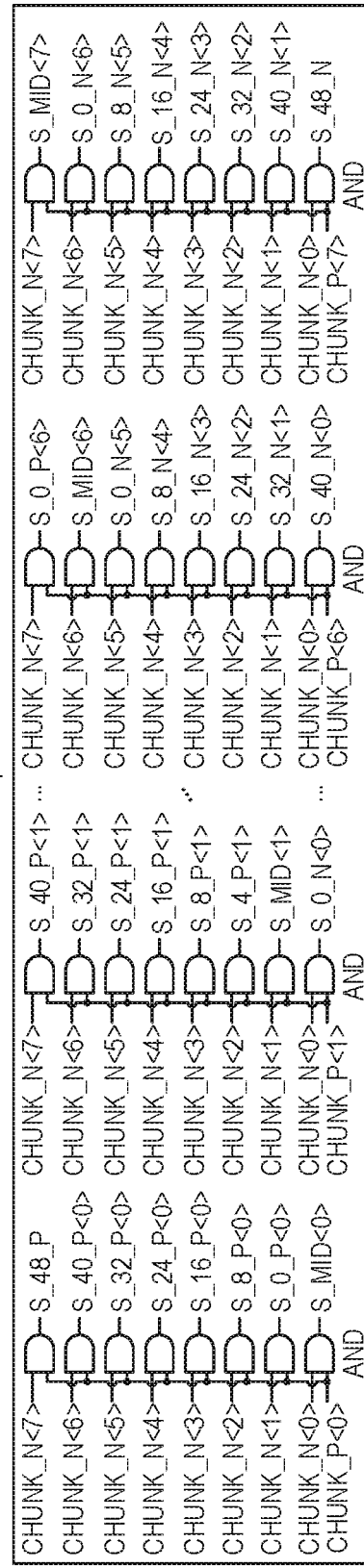
Fig. 13

ANALOG-TO-DIGITAL CONVERTER CIRCUIT WITH A NESTED LOOK UP TABLE

BACKGROUND

The present disclosure relates to the digitization of analog signals.

The digitization of an input signal may be performed by an analog-to-digital converter (ADC). One parameter of interest is the latency of the analog-to-digital converter.

SUMMARY

In one aspect the disclosure provides for an analog-to-digital converter circuit that is configured for digitizing an analog input signal. The analog-to-digital converter comprises an analog input configured for receiving the analog input signal. The analog-to-digital converter further comprises at least one sub-ADC or analog-to-digital converter connected to the analog input signal. The at least one sub-ADC is configured to output at least one encoded output vector in response to receiving the analog input signal.

The analog-to-digital converter circuit further comprises a subtractor circuit comprising a nested lookup table. The subtractor circuit is configured to select an output value from the nested lookup table using the at least one encoded output vector. The lookup circuit is configured to provide the output value as a digitization of the analog input signal.

According to a further aspect of the present disclosure, the disclosure provides for a digital sampling oscilloscope configured for receiving the input signal. The digital sampling oscilloscope comprises the analog-to-digital converter circuit.

According to a further aspect of the present disclosure, disclosure provides for a telecommunications receiver circuit configured for receiving the input signal. The telecommunications receiver circuit comprises the analog-to-digital converter circuit.

BRIEF DESCRIPTION OF THE SEVERAL VIEWS OF THE DRAWINGS

FIG. 12 shows an abstraction of the lookup table in FIG. 11.

DETAILED DESCRIPTION

Figure 1:
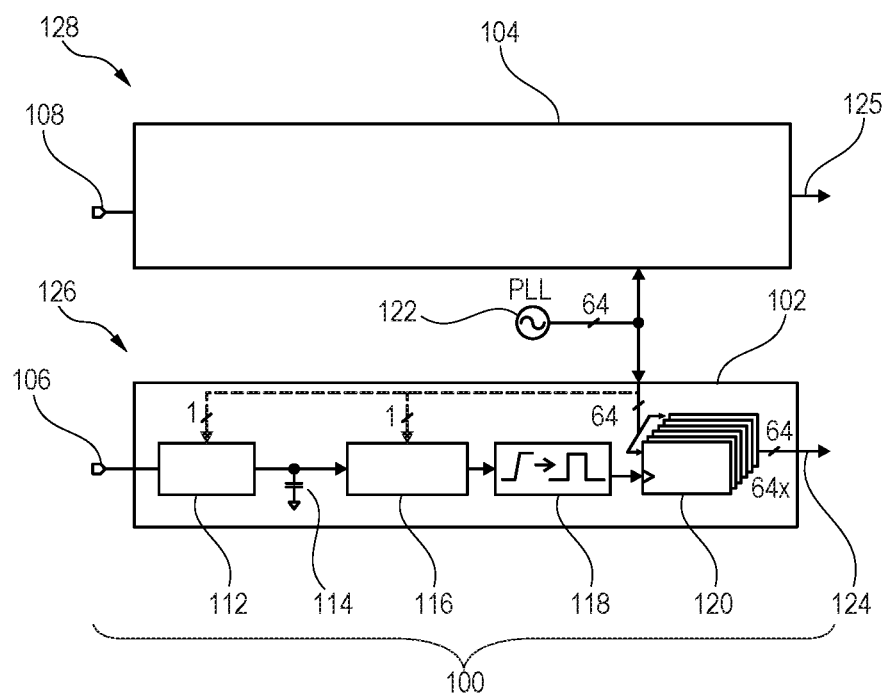
FIG. 1 illustrates an example of an analog-to-digital converter.
Figure 1:
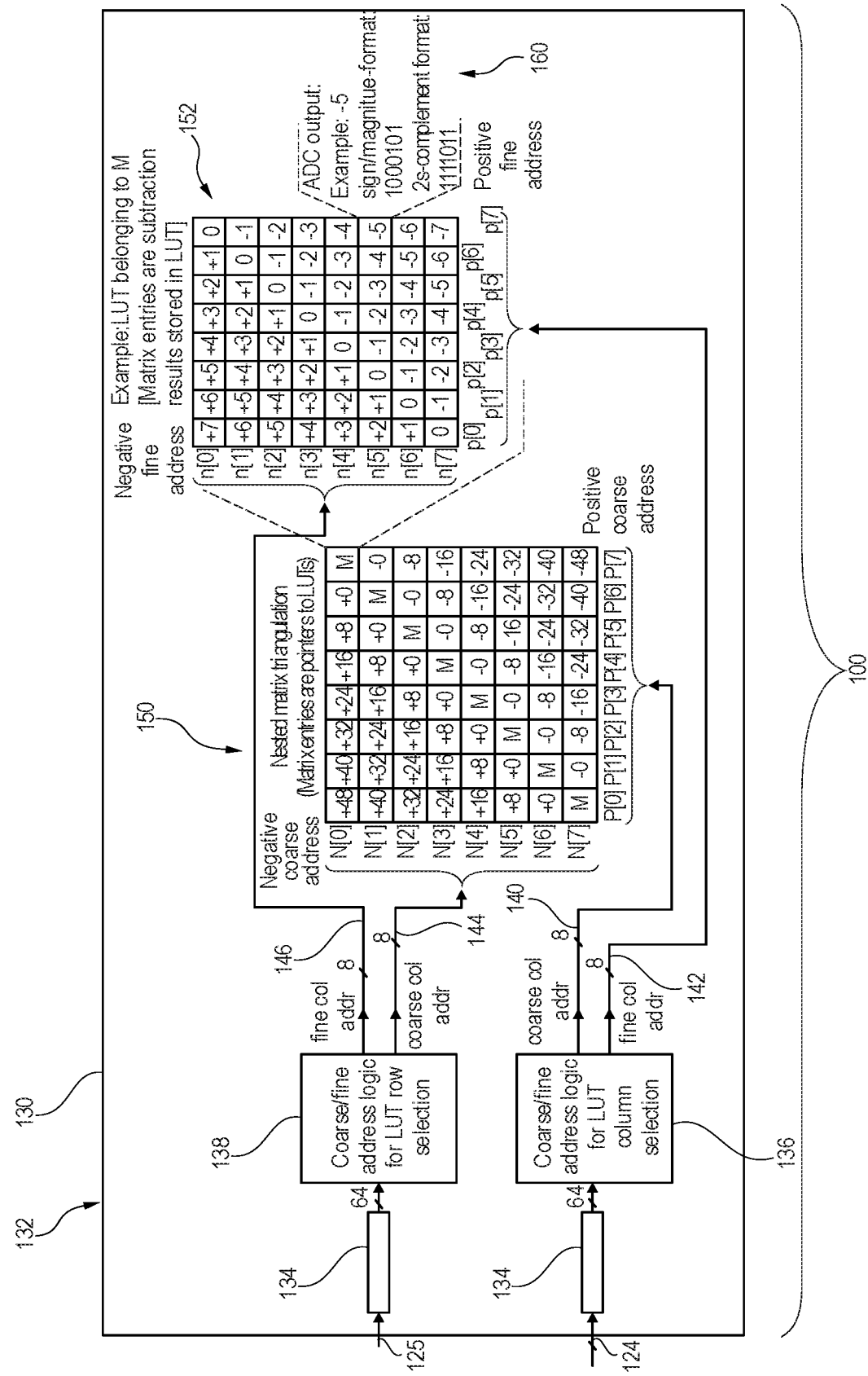

The descriptions of the various embodiments of the present disclosure will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments may be beneficial because they may provide for an analog-to-digital converter circuit that has lower latency and may remove the need for a digital signal processor (DSP) to determine the output vector.

In another embodiment the analog input signal is a differential analog input signal. The analog input comprises a negative analog input and a positive analog input. The negative analog input and the positive analog input are configured for receiving the differential analog input signal. The at least one sub-ADC comprises a first sub-ADC and a second sub-ADC. The first sub-ADC is connected to the positive analog input. The first sub-ADC is configured to output a first encoded output vector in response to receiving the positive analog input of the differential analog input signal. The second sub-ADC is configured to output a second encoded output vector in response to receiving the negative analog input of the differential analog input signal.

The lookup circuit is a subtractor circuit comprising the nested lookup table. The subtractor circuit is configured to select a subtractor value from the nested lookup table using the first encoded output vector and the second encoded output vector as the output value. The subtractor circuit is configured to output the subtractor value as the digitization of the differential analog input signal. This embodiment may be beneficial because the use of the subtractor circuit with the nested lookup tables may provide for a reduced latency and the reduced need for a DSP to provide these functions.

In another embodiment the subtractor circuit comprises a first address logic block and a second address logic block. The first address logic block is configured to generate a first coarse address and a second fine address in response to the subtractor circuit receiving the first encoded output vector. The second address logic block is configured to generate a second coarse address and a second fine address in response to the subtractor circuit receiving the second encoded output vector. The subtractor circuit is configured to choose the subtractor value from the nested lookup table using the first coarse address, the second coarse address, the first fine address, and the second fine address. The dividing of the coarse addresses into the first and second coarse address as well as dividing the fine address into the first fine address and the second fine address facilitates the use of a nested lookup table.

The nested lookup table comprises a discrete number of fine lookup tables and a coarse lookup table. In other words, there is a single coarse lookup table and then a discrete number or multiple fine lookup tables. The entry of each coarse lookup table comprises a selection of one of the discrete number of fine lookup tables. For example, each entry of the coarse lookup table could contain a pointer to one of the discrete number of fine lookup tables.

Each entry of the selection of the one or more discrete number of fine lookup tables comprises the subtractor value. The subtractor circuit is configured to choose the selection of the one of the discrete number of fine lookup tables using the first coarse address and the second coarse address. The subtractor circuit is configured to choose the final subtractor value from the one of the discrete number of fine lookup tables using the first fine address and the second fine address.

In other words, the first coarse address and the second coarse address are first used with the coarse lookup table to select one of the discrete number of fine lookup tables. After a particular fine lookup table has been selected, the first fine address and the second fine address are used with that particular fine lookup table to choose the final subtractor value. This embodiment again may provide for an analog-to-digital converter circuit that has a reduced latency.

In another embodiment at least one of the discrete number of fine lookup tables is selectable by more than one entry of the coarse lookup table. The coarse lookup table is preferably arranged as a two-dimensional array with the more than one entry of the coarse lookup table arranged along a diagonal of the array. This embodiment may be beneficial because it may reduce the amount of memory or electronic circuitry that is used to store the discrete number of fine lookup tables. A particular fine lookup table may be reused multiple times.

In another embodiment the first encoded output vector is a first thermometer encoded output vector. The second encoded output vector is a second thermometer encoded output vector. The subtractor circuit further comprises a first one-hot encoder to convert the first thermometer encoded output vector into a first one-hot encoder. The second subtractor circuit further comprises a second one-hot encoder to convert the second thermometer encoded output vector into a second one-hot encoded vector. The first address block is configured to output the first coarse address and the first fine address in response to receiving the first one-hot encoded vector. The second address block is configured to output the second coarse address and the second fine address in response to receiving the second one-hot encoded vector. The use of these encoders may be beneficial because it provides for extremely fast operation and, as was mentioned before, may provide for lower latency input and output of the analog-to-digital converter circuit In another embodiment the first coarse address and the first fine address are generated from the first one-hot encoded vector using a first tri-stable device logic network. The second coarse address and the second fine address are generated from the second one-hot encoded vector using a second tri-stable device logic network. These devices are also extremely efficient and fast and may provide for a lower latency.

In another embodiment the at least one sub-ADC each comprises a sampling capacitor and a sampling switch for connecting the analog input to the sampling capacitor. Each of the at least one sub-ADC further comprises a voltage-to-time converter for converting the voltage of the sampling circuit into a voltage ramp. The at least one sub-ADC further comprises a pulse generator configured for converting the voltage ramp into a pulse signal. Each of the at least one sub-ADC further comprises multiple sampling latches to generate the first encoded output vector and the second encoded output vector in response to receiving the pulse signal.

In another embodiment the analog-to-digital converter circuit comprises a centralized multiphase clock generator for generating multiphase clock signals for controlling the multiple sampling latches. This may be beneficial because it provides an efficient way of providing for interleaving when operating the analog-to-digital converter circuit.

In another embodiment the multiple sampling latches each have a clock input connected to the centralized multiphase clock generator. The multiple sampling latches each have a sampling input connected to a chosen signal provided by the voltage-to-time converter via the successive edge-to-pulse converter.

In another embodiment the multiple sampling latches each have a sampling input connected to a chosen signal provided by the voltage-to-time converter. The multiple sampling latches each have a clock input connected to the centralized multiphase clock generator.

In another embodiment each of the at least one sub-ADC comprises a sampling capacitor and a sampling switch for connecting the analog input to the sampling capacitor. Each of the at least one sub-ADC comprises a voltage-to-time converter converting a voltage of the sampling capacitor into a voltage ramp. Each of the at least one sub-ADC further comprises a multiphase VCO configured to generate VCO pulses. Each of the at least one sub-ADC further comprises an integer counter configured to generate first encoded output vectors and second encoded output vectors by counting the VCO pulses until the voltage ramp changes a binary state.

In another embodiment the at least one sub-ADC is multiple sub-ADCs. That is to say that there is more than at least one sub-ADC. The multiple sub-ADCs provide an interleaved data path. The use of an interleaved data path may be beneficial because it may provide for a means of increasing the sampling frequency while maintaining the latency and throughput of the analog-to-digital converter circuit.

In another embodiment the at least one sub-ADC is at least one time-based sub-ADC. That is to say the sub-ADCs are time-based sub-ADCs.

In another embodiment the nested lookup table comprises connections for any one of the following in the subtractor circuit: a bubbling correction, a non-linearity correction, and combinations thereof.

In another embodiment the nested lookup table encodes the subtractor value in twos complement format or in sign and magnitude format.

In another embodiment the at least one sub-ADC is a single sub-ADC. The output value is an absolute value representing the analog input in the digital domain. The majority of the application describes an analog-to-digital converter circuit which comprises an input and a passive analog input. However, the techniques applied to this differential analog input are also applicable to a single analog-to-digital converter.

In another embodiment the lookup circuit comprises an address logic block. The address logic block is configured to generate a coarse address and a fine address in response to the lookup circuit receiving the encoded output vector. The lookup circuit is configured to choose the output value from the nested lookup table using the coarse address and the fine address. This embodiment may be beneficial because it may provide for a means of enabling an analog-to-digital converter circuit that has a single sub-ADC but yet maintains a low latency.

FIG. 1 illustrates an example of an analog-to-digital converter circuit 100. In this example there is a first sub-ADC 102 and a second sub-ADC 104. The implementation of the second sub-ADC 104 is not shown but it is analogous to the details shown in the first sub-ADC 102. In this example there is a differential analog input that is formed by a positive analog input 106 and a negative analog input 108. In the sub-ADCs 102, 104 the inputs 106, 108 are connected to a sampling switch 112 that is connected to a sampling capacitor 114. This is then connected to a voltage-to-time converter 116 and then a pulse generator 118. These are then connected to sampling latches 120 that are controlled by a multiphase clock generator 122. The sampling latches 120 in the first sub-ADC 102 outputs a first encoded output vector 124. The second sub-ADC 104 outputs a second encoded output vector 125 similarly. The first encoded output vector 124 is input into a one-hot encoder 134 and then into a first address logic block 136. This generates a first fine address 142 and a first coarse address 140.

Likewise, the second encoded output vector 125 is also input into a one-hot encoder 134 which is then connected to a second address logic block 138. The second address logic block 138 outputs a second coarse address 144 and a second fine address 146. The first sub-ADC 102 forms an even data path 126 and the second sub-ADC 104 forms an odd data path 128.

The analog-to-digital converter circuit 100 also comprises a lookup circuit 132. In this example, the lookup circuit 132 implements a subtractor circuit 130. Within the lookup circuit 132 is located the nested lookup table. This is formed by a coarse lookup table 150 and multiple fine lookup tables 152.

The first coarse address 140 and the second coarse address 144 are used to select an entry from the coarse lookup table 150. These for example could be pointers to one of the fine lookup tables 152. An entry from the fine lookup table 152 is selected using the first fine address 142 and the second fine address 146. The output of the lookup table 152 is then the output value 160.

As was mentioned above, FIG. 1 shows a time-based analog-to-digital converter 100 (ADC) with two sub-ADCs 102, 104. The two sub-ADCs 102, 104 receive the differential analog input signal. Each analog input 106, 108 is first sampled by a sampling switch 112. The sampled voltage is then fed to a voltage-to-time converter (VTC) 116 that generates a signal edge at its output when the input signal falls below a certain threshold value. The sampling switch 112 and the VTC 116 of the two sub-ADCs are clocked with in-phase (0°) and out-of-phase (180°) clocks so that the two sub-ADCs constitute even 126 and odd 128 data paths. The signal edge of the VTC output is converted to a pulse that is then applied to the clock input of 64 sampling latches 120.

The number of sampling latches can be different than 64. The value of 64 is chosen here for an exemplary 6 b ($2^6$=64) converter. At the data input of the 64 sampling latches a multiphase signal with 64 phases is applied. The output of the 64 samplers is a kind of thermometer code consisting of 32 logical 1s and 32 logical 0s. Between the even and odd data path the series of logical 1s typically start at different positions within the 64 b output vector. Only when the two differential inputs are both at the common mode voltage level, the series of logical 1s start at the same position. This position corresponds to the value 0 at the ADC output. If the input signal of the positive data path is below and the input signal of the negative data path is above the input common mode voltage, the ADC output is negative, otherwise it is positive.

The valid position of the 0-to-1 transition within the thermometer-encoded output vector of the sampling latches is determined by two 1-hot encoders, one for each data path at the input of the lookup table (LUT) based subtractor. Because the block of logical 1s is not aligned to the endings of the 1-hot encoded vectors there are two edges of which only the first 0-to-1 transition is valid. The two 1-hot encoded data vectors have a length of 64 b each and they are fed to two address logic blocks that analyze the position of the logical 1 in the pertinent 1-hot encoded input vectors. The two address logic blocks 136, 138 output the coarse 140, 144 and fine addresses 142, 146 for the columns and the rows in the LUT. The coarse address is obtained by an 8 b binning across the 64 b wide 1-hot encoded vectors. The 8 b data of the bin that contains the singular logical one in the rows and columns coarse addresses is used as fine address for the rows and columns. The overall LUT consists of two nested LUTs. While the entries of the first 8 b×8 b LUT 150 are addressed by the rows and columns coarse addresses, the fine addresses are used to lookup the final subtractor value, which is stored in the second LUT 152 whose dimensions are also 8 b×8 b. Each entry of the first LUT contains an 8 b×8 b table of the second LUT type 152. The fine addresses then select the final subtractor value, which is fed to the ADC output 160 and corresponds to the digitized value of the ADC input. Nested LUTs are used because a single LUT with 64 b×64 b=4096 entries instead of twice 64 entries is prohibitive from an output loading perspective. Moreover, the nested LUT approach allows a better exploitation of symmetries within the overall LUT, e.g., 29−4=25 and 47−22=25 have the same value, which needs to be stored just once. The locations of equal output value are along the offset-diagonals.

Figure 2:
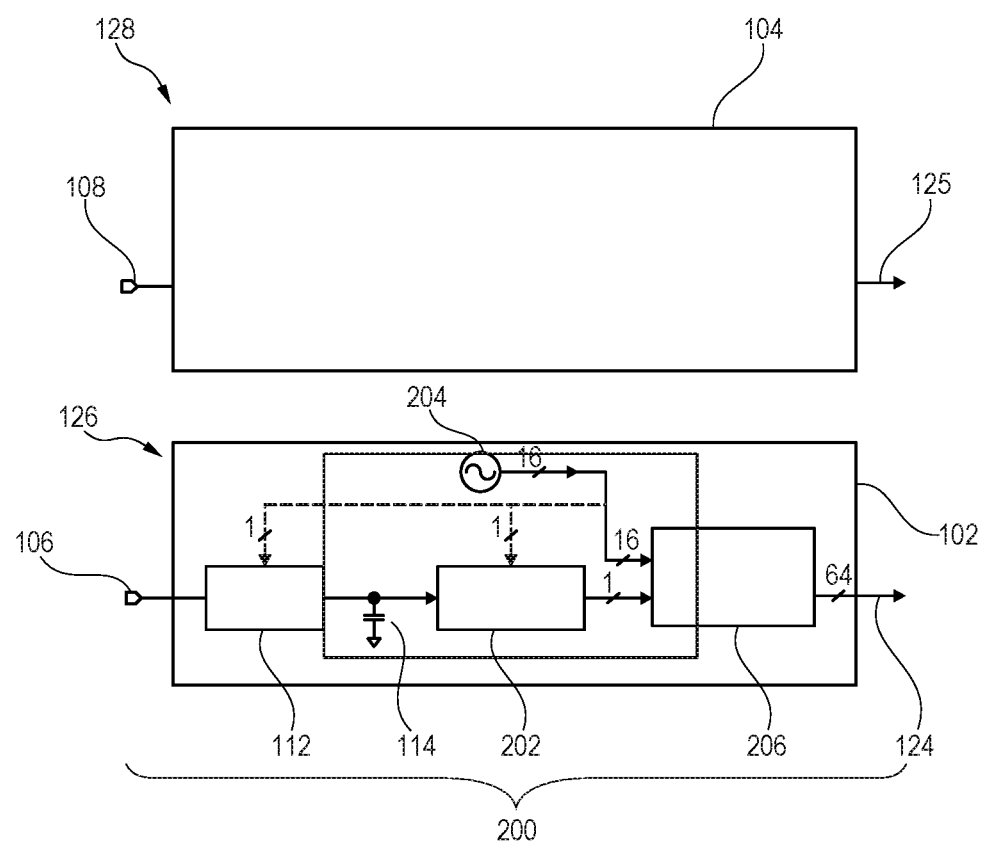
FIG. 2 illustrates a further example of an analog-to-digital converter.
Figure 2:
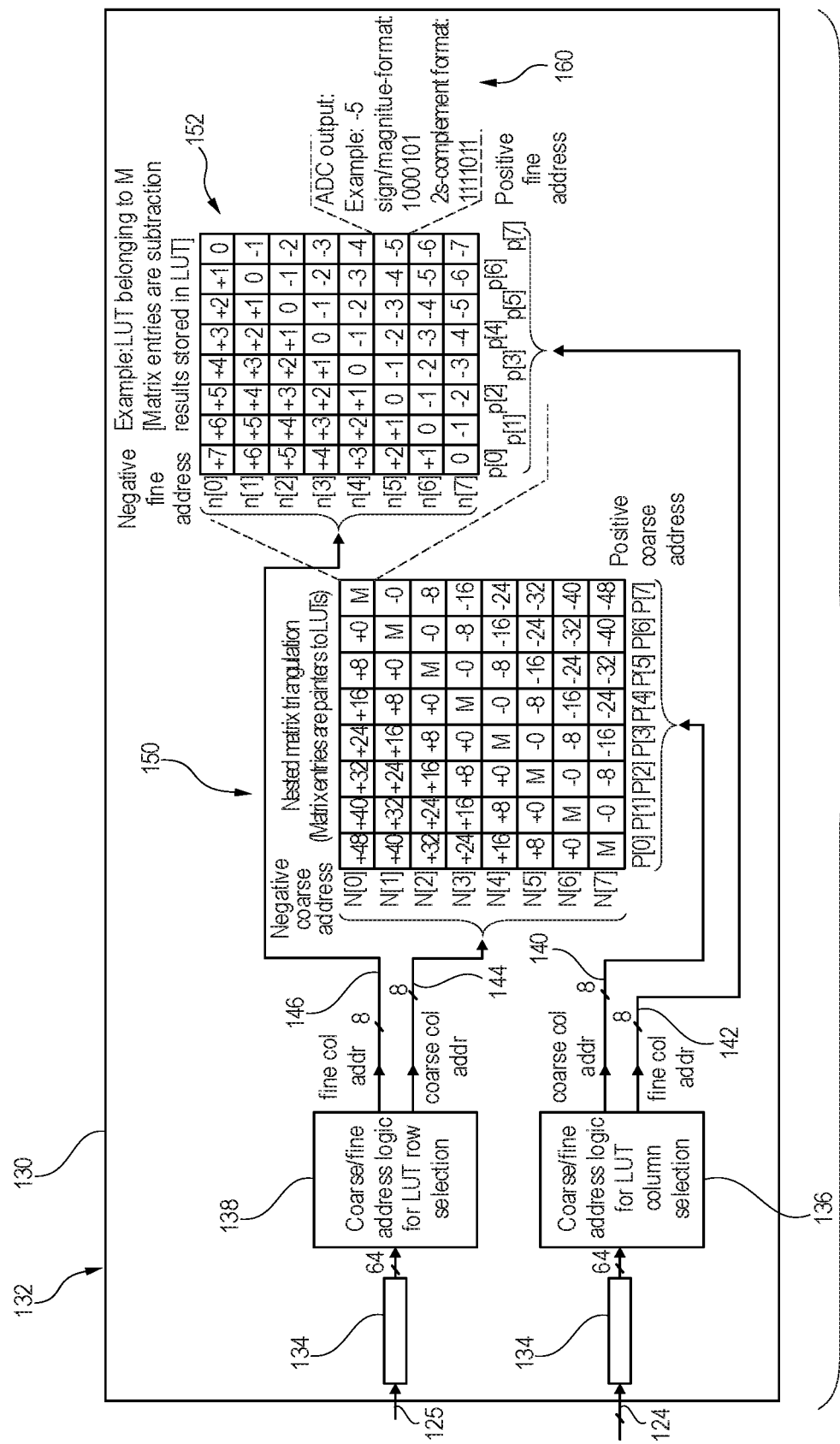

FIG. 2 shows a further example of an analog-to-digital converter circuit 200. This figure illustrates a time-based ADC with a LUT implementing the subtraction of the differential input signal within the sub-ADC slices. The example illustrated in FIG. 2 is similar to that in FIG. 1 except the first sub-ADC 102 and the second sub-ADC 104 have been modified. The ADC of FIG. 2 is similar to the ADC of FIG. 1 with the exception that it uses a different concept to generate the 1-hot encoded vectors. The pulse generator 118 and the sampling latches 120 have been replaced with a voltage-to-time converter 202, a multiphase VCO 204, and a start-stop counter 206.

Figure 3:
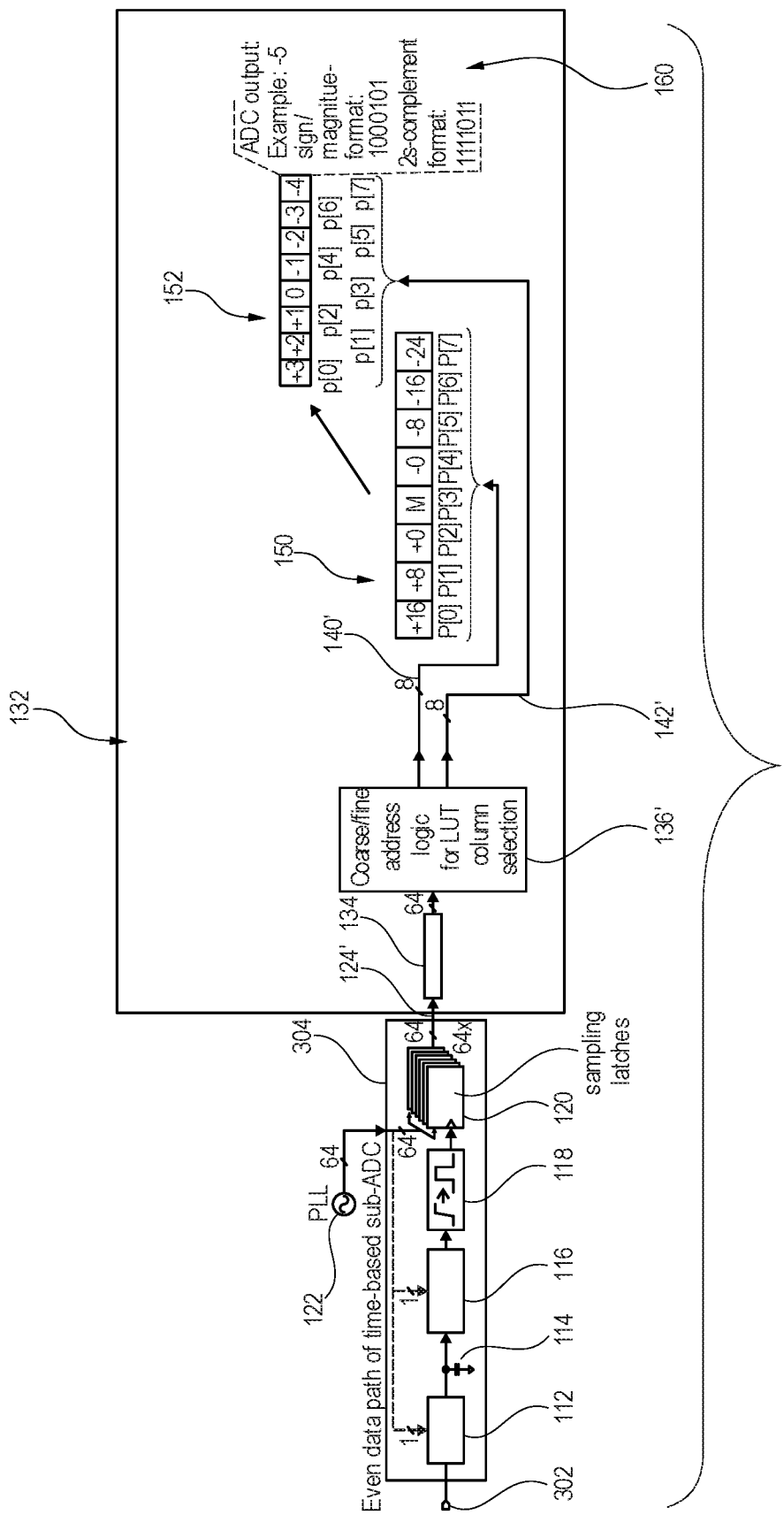
FIG. 3 illustrates a further example of an analog-to-digital converter.

Here the VTC 202 output signal is used to control a start/stop counter 206 that receives a multiphase signal consisting of 16 phases from a voltage-controlled-oscillator (VCO) that is operated with a fixed tuning voltage. Once the VTC starts discharging the sampling capacitor, a start signal enables the counter that then counts the VCO edges until the VTC output flips, which then stops the counting. Typically, there is an integer counter 206 to count the oscillation periods that have elapsed between the assertion of the start and stop signals. This gives a binary number. In addition to that the current state of the VCO during the stop event is read out, which has a thermometer data format. The combination of the binary and thermometer value can be combined to form a similar thermometer encoded vector that has already been described at FIG. 1. FIG. 3 illustrates a further example of an analog-to-digital converter circuit 300. In this example there is only a single sub-ADC 304. It is however structured similarly to the way it is in FIG. 1. The modification made between the embodiments shown in FIGS. 1 and 2 could also be made to FIG. 3. In this example there is a single analog input 302 which connects to the single sub-ADC 304. This then outputs an encoded output vector 124' that goes to the one-hot encoder 134. This then goes to the address logic block 136' which provides a coarse address 140' and a fine address 142'. The coarse address 140' is used to select an entry from the coarse lookup table 150. Similarly, this may contain a pointer to a fine lookup table 152. The fine address 142' is then used to select the entry from the fine lookup table 152. The output is again then the output value 160.

In FIG. 3 there is only a single ended input and there is only a single sub-ADC. However, the number of sub-ADCs may be increased. The single ended input (in this example) or differential inputs (in other examples) may be fanned out to additional internal inputs that are connected to the increased number of sub-ADCs to provide for a higher degree of interleaving.

Figure 4:
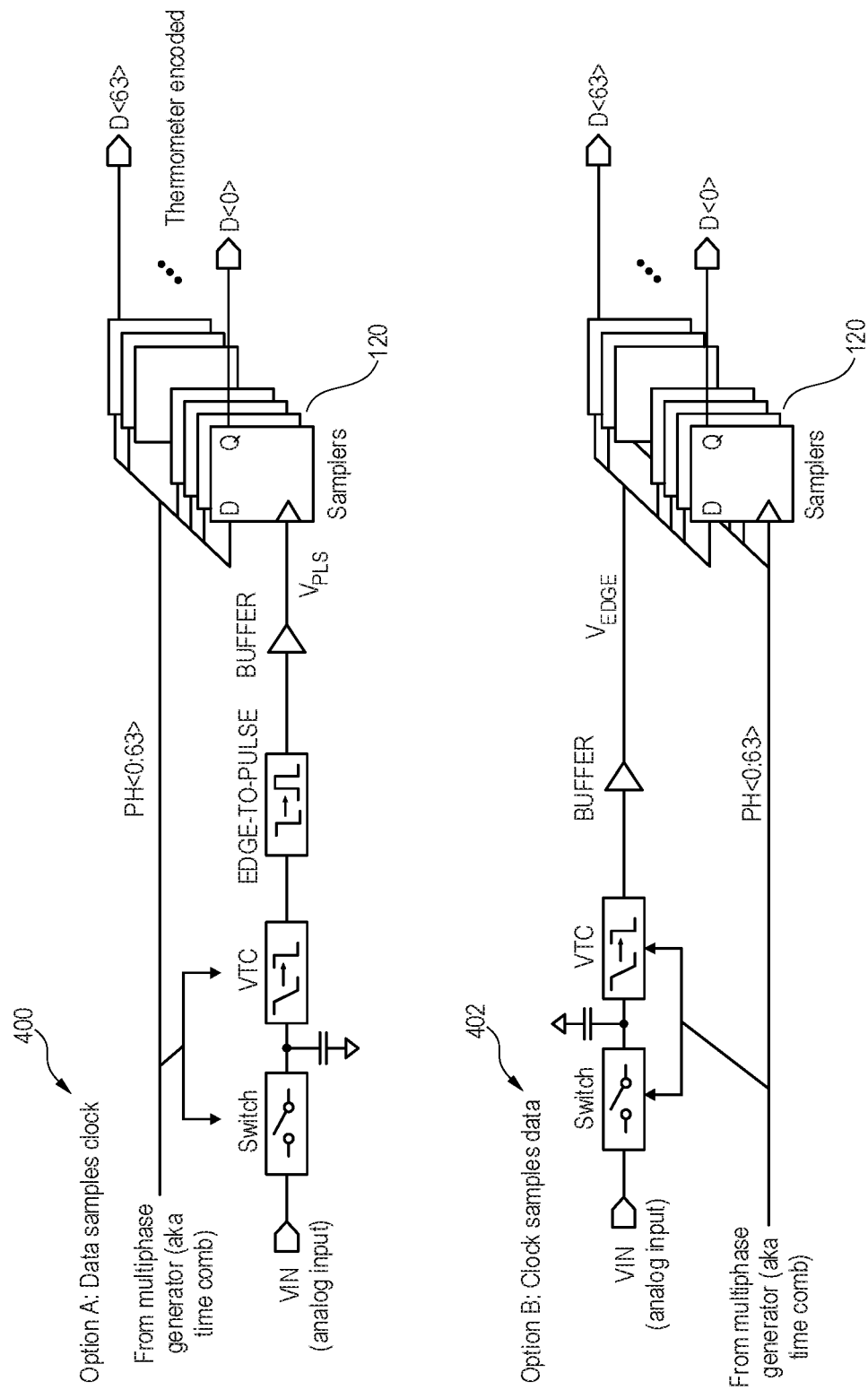
FIG. 4 illustrates several options of how the VTC signal can be converted to the time domain.
Figure 4:
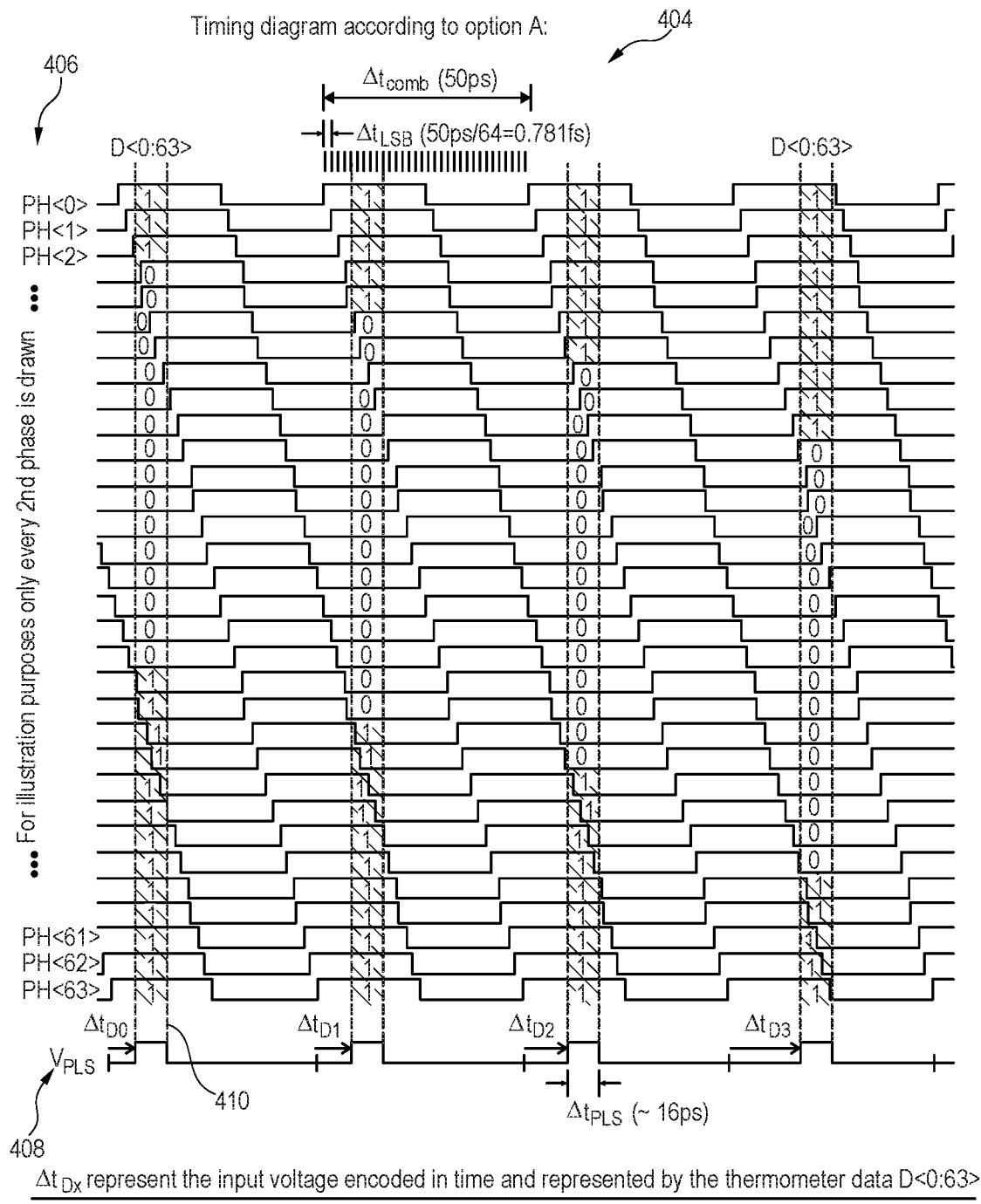

The left-hand side of FIG. 4 shows two options 400, 402 on how the VTC output signal can be converted into timing information to convert the analog input voltage to the time domain. In option A 400 the VTC output is converted to a pulse that is then applied to the clock input of 64 sampling latches. The sampling latches have a multiphase clock signal at their inputs. An exemplary timing diagram of Option A 400 is shown on the right-hand side of FIG. 4. Vertically from top to bottom there are the 64 multiphase signals 406 PH<0> through PH<63>. The signal at the bottom 408 shows the sampling pulses, while the pertinent sampled values are indicated above in the waveforms.

Each sampling pulse has a preceding arrow in front of it whose length reflects the value of the sampled analog value. In other words: The position of the pulse (indicated by the arrow length) is mapped to the pertinent sampled vector of 64 bits indicated vertically in the multiphase signals. Each vertical sampled vector starts with a series of 1s, followed by a series of 32 zeros, which is again followed by the remaining logical 1s until the end of the 64 b wide vector. The position of the first 1-to-0 transition 410 moves out more the longer the previously described arrow in the last sampling pulse waveform is. The objective is to the determine the exact position of this first bit transition as this is then the digitized value of the analog input.

At option B 402 the sampling latch inputs are swapped so that the edge of the VTC (no edge-to-pulse conversion is required) is fed to all D-inputs of the sampling latches, while the multiphase clock signal is applied to their clock input. A pertinent waveform is not shown but it becomes clear that the multiphase signal samples the VTC output edge such that the resulting vector at the output of the latches is a thermometer encoded vector like the vertical sampling vectors indicated in the waveform diagram. Simulation results have shown that the power consumption of option B 402 is higher than that of Option A 400 since the latter uses a small pulse for sampling as opposed to using wide pulses (=50% duty cycle multiphase clock edges).

Figure 5:
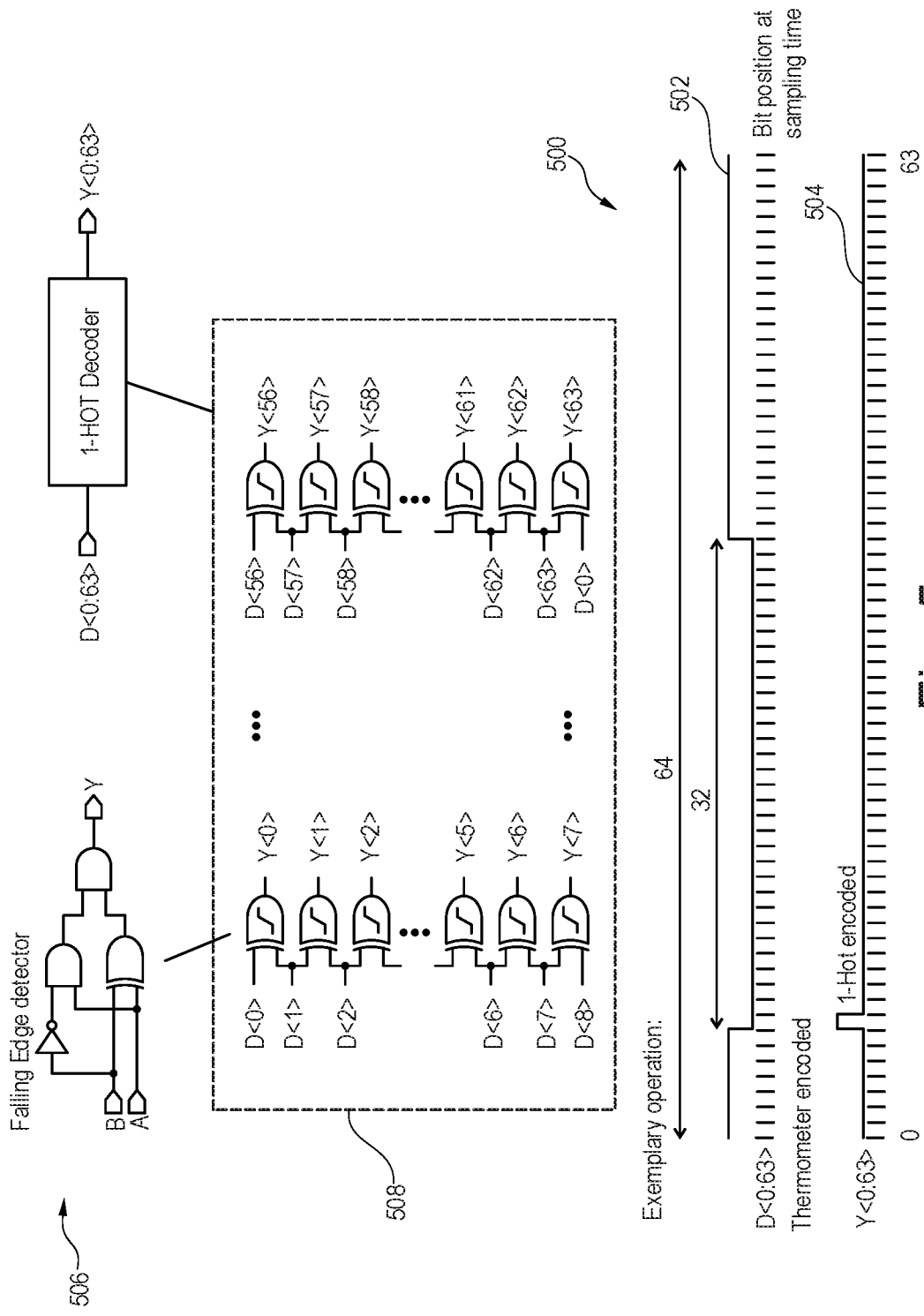
FIG. 5 shows illustrates a thermometer-like sampling vector, a 1-hot encoded vector, a 1 to 0 edge identification circuit, and falling edge detectors.

FIG. 5 shows at the bottom 500 an example of the thermometer-like sampling vectors 502 indicated in the waveforms in FIG. 4 together with the conversion to a 1-hot encoded vector 504. It is shown that the first bit transition— namely the 1-to-0 transition—is the correct transition because this then defines the correct position of the logical 1 in the 1-hot encoded vector, which represents the analog input voltage in the digitized domain.

The circuitry in the upper part 506 of FIG. 5 shows the logic that identifies the 1-to-0 transition out of the two possible bit transitions. It is basically an XOR-gate with some gating logic to disable the wrong 0-to-1 transition if it is assumed that the input B occurs one bit position after the input A.

The falling edge detector building blocks are connected next to each other according to the box 508 in the middle of FIG. 5. Adjacent blocks each share a bit position of the thermometer-like sampling vector. The term <thermometer-like> instead of just <thermometer> is used because the thermometer-like code has two transitions where a true thermometer code would have just one, which could be detected by a simple XOR gate instead of the previously described falling edge detector.

Figure 6:
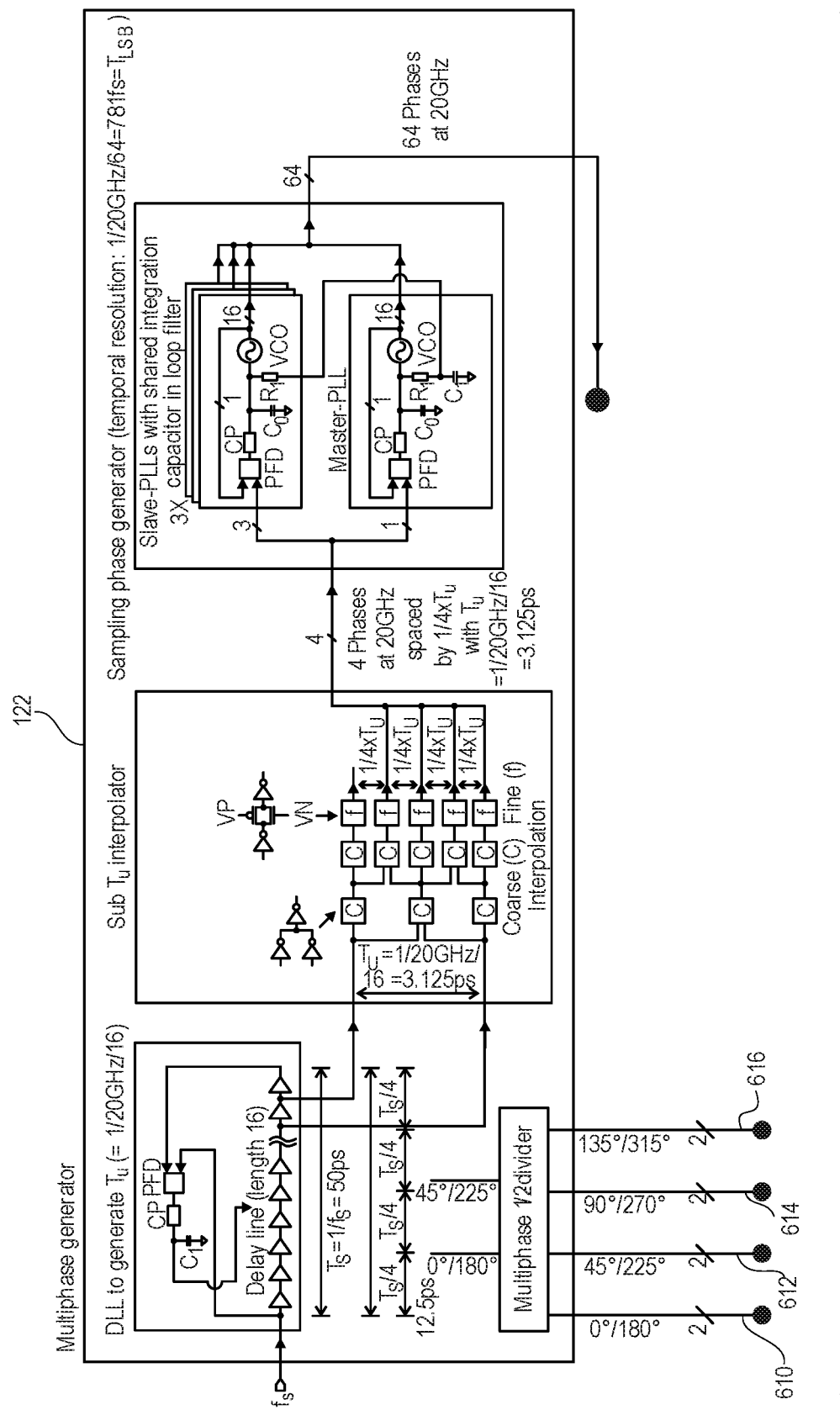
FIG. 6 illustrates a further example of an analog-to-digital converter.
Figure 6:
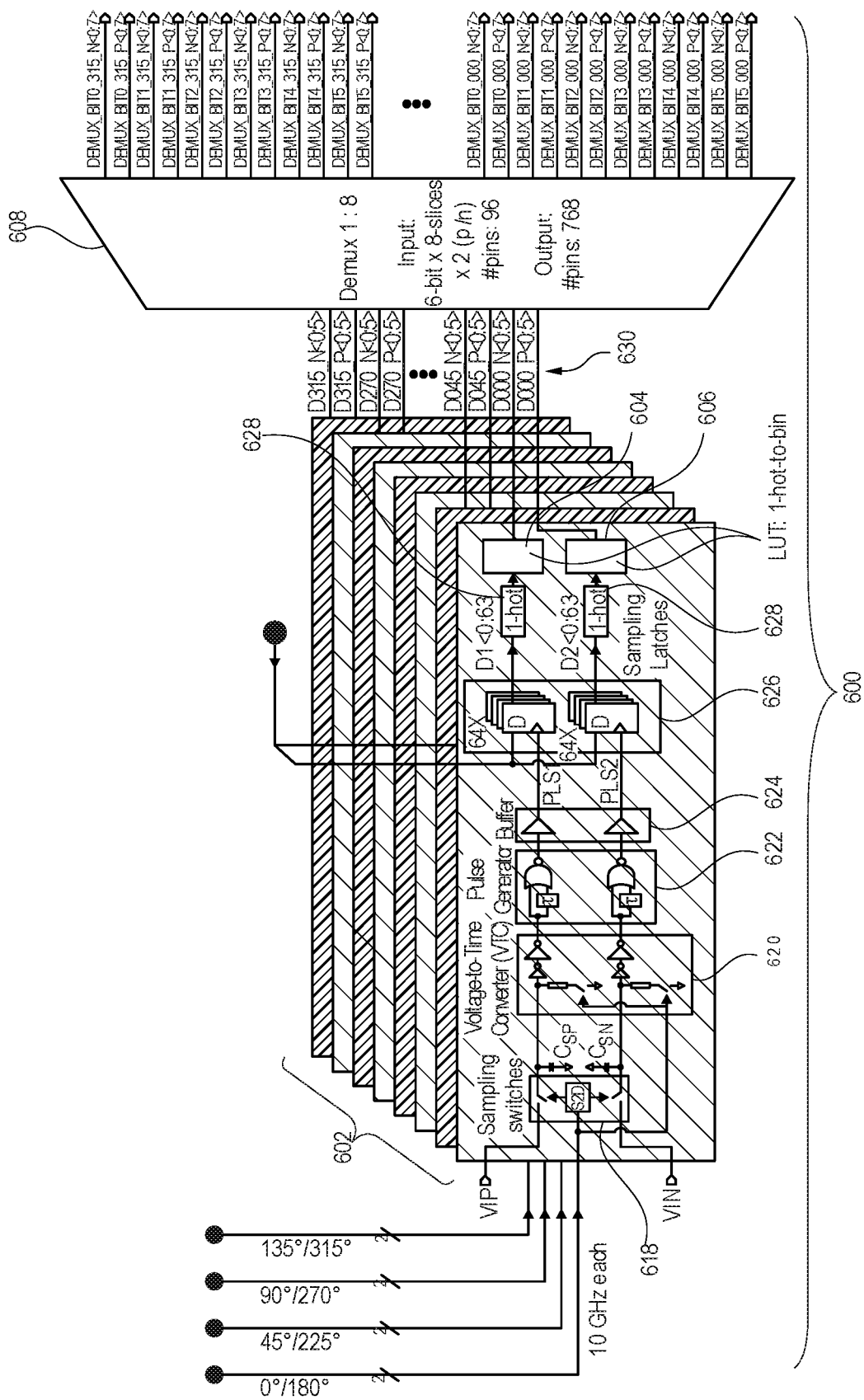

FIG. 6 shows a time-based ADC 600 with 8× time-interleaved sub-ADC slices 602 where each of them has two separate LUTs for the positive 604 and negative 606 ADC inputs and the LUT outputs are 1:8 demultiplexed to a data-processing unit (not shown) that runs at 8× slower speed than the sub-ADCs.

FIG. 6 shows the block diagrams of a time-based ADC consisting of a clock generator 122, eight sub-ADC slices 602 and one output demultiplexer 608. In the upper part the multiphase generator 122 is shown that generates 64 sampling phases used for the sampling of the voltage-to-time converted analog input signals (VIP and VIN) and it also provides 4 phase pairs ([0°, 180°] 610, [45°, 225°] 612, [90°, 270°] 614, [135°, 315°] 616) for the operation of the 8× time-interleaved sub-ADCs. Each sub-ADC 612 consists of a (differential) sampling switch, a voltage-to-time converter (VTC) 620 and an edge-to-pulse generator 622 with successive buffering 624. The pulses from the VTCs in the positive and negative data paths are fed to the clock input of the 64 sampling latches 626 that sample the multiphase signals according to Option A 400 described above.

The outputs of the sampling latches are fed separately in each data path to a 1-hot encoder 628 whose output is used as address to lookup in a LUT 604, 606 the digitized value belonging to the analog value of the pertinent data path. The LUT outputs 630 are demultiplexed with a factor 1:8 so that a successive data-processing unit (not shown in the drawing) can calculate the subtraction between the two digitized values of the positive and negative data path at an 8× lower speed than the conversion rate of a single sub-ADC. Note that the sub-ADCs are operated preferably at a higher conversion rate than the synthesized digital-processing unit to reduce the time-interleaving factor at the ADC input for ultra-high bandwidth A/D converters.

A high time-interleaving factor (e.g., 64) uses a more complex multi-rank clocking scheme for the analog data signal sampling and increases the parasitics at the input sampler, which compromises the input bandwidth. As a consequence, the sub-ADC conversion rate is chosen as high as possible, which then entails a demultiplexer at the sub-ADC outputs to match the sub-ADC conversion rate to the data rate of the successive data-processing unit, whose maximum data rate is the synthesis parameters (i.e., the phase file). For the further discussion it is important to note that the subtraction of the digitized values provided by the LUTs is performed outside the sub-ADC slices in the digital-signal processing unit. This means that the LUT can be kept simple as it does not need to perform the subtraction. An example with a LUT-based subtractor will be shown below.

Figure 7:
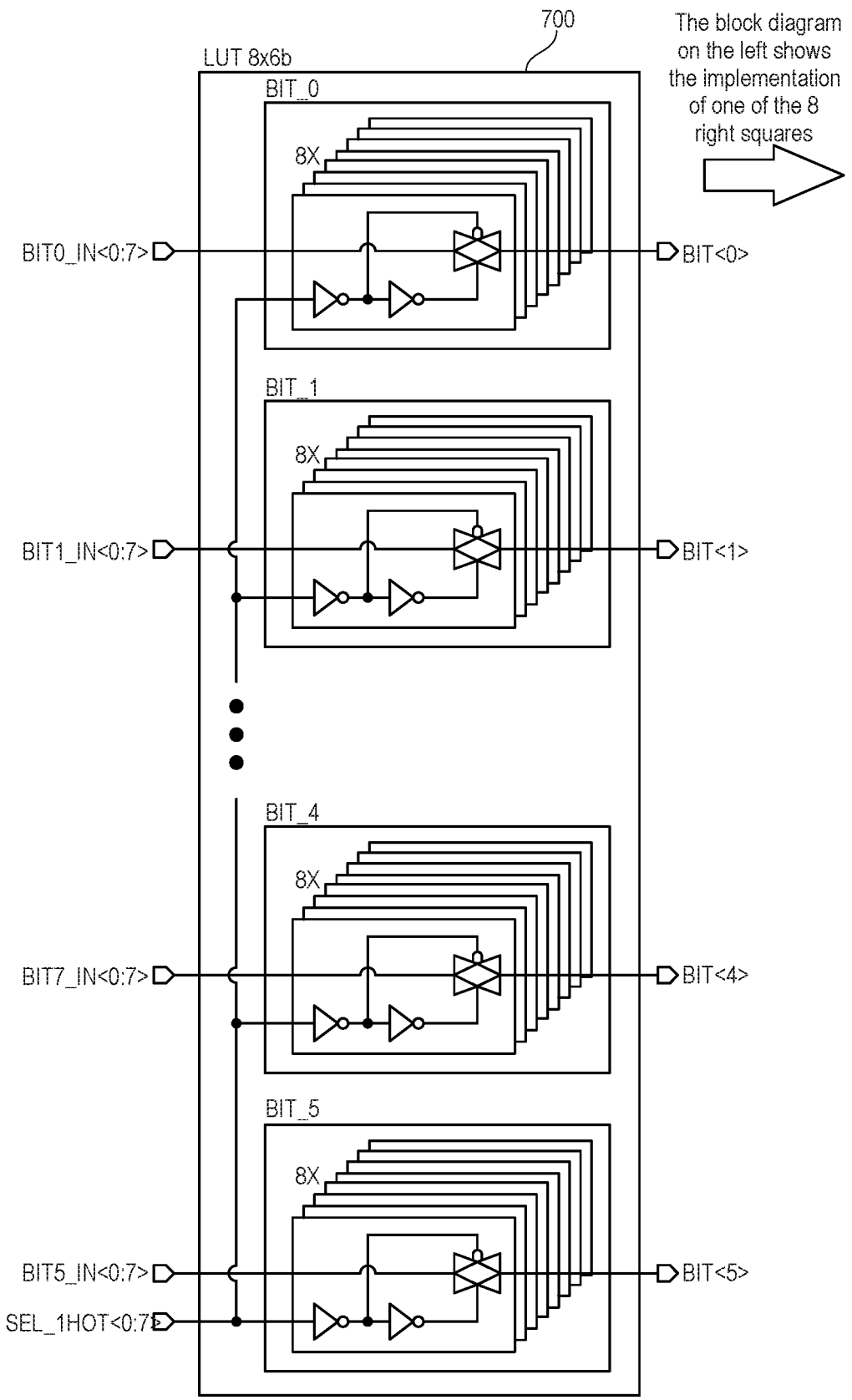
FIG. 7 illustrates an example of a lookup table implementation.
Figure 7:
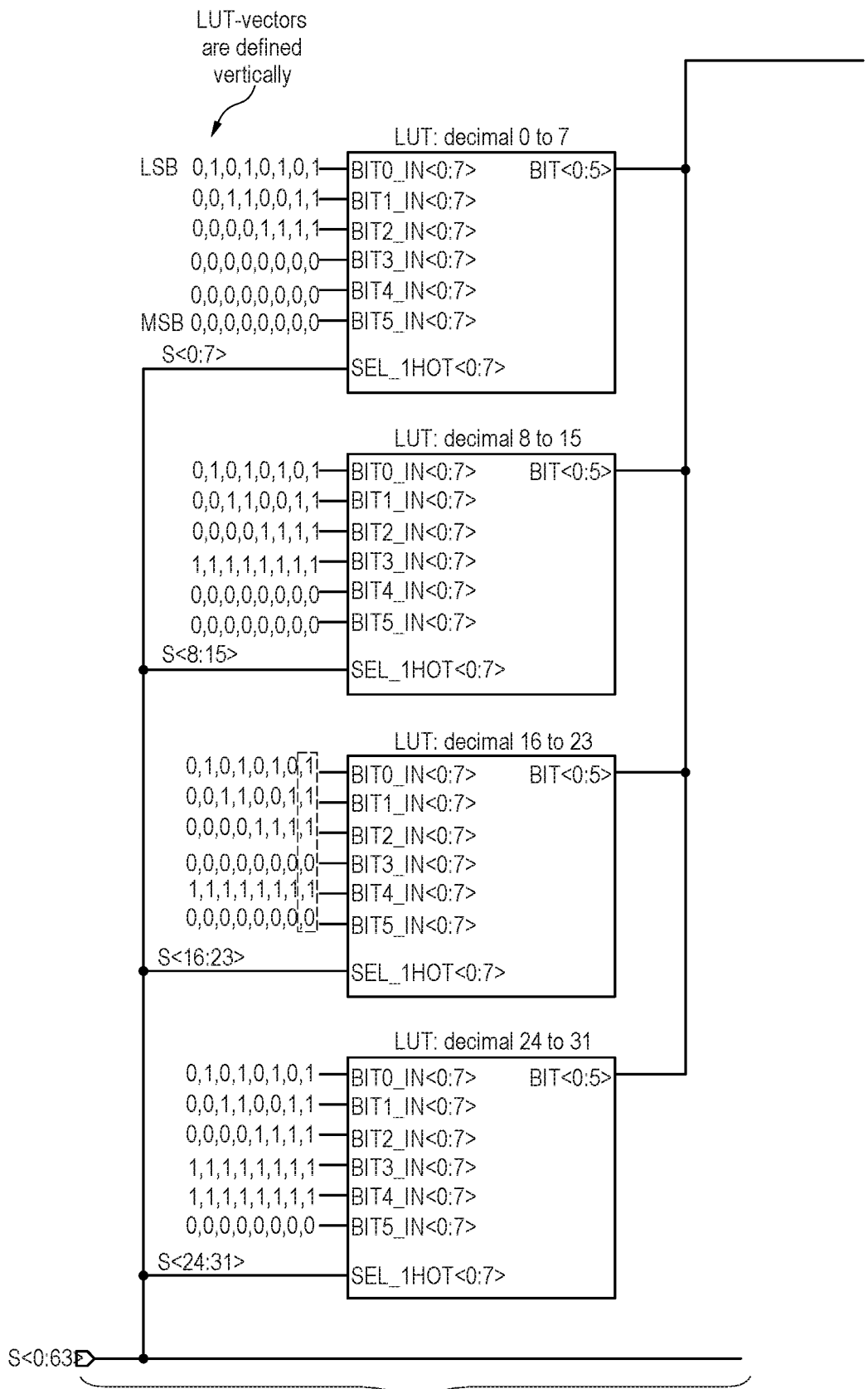
Figure 7:
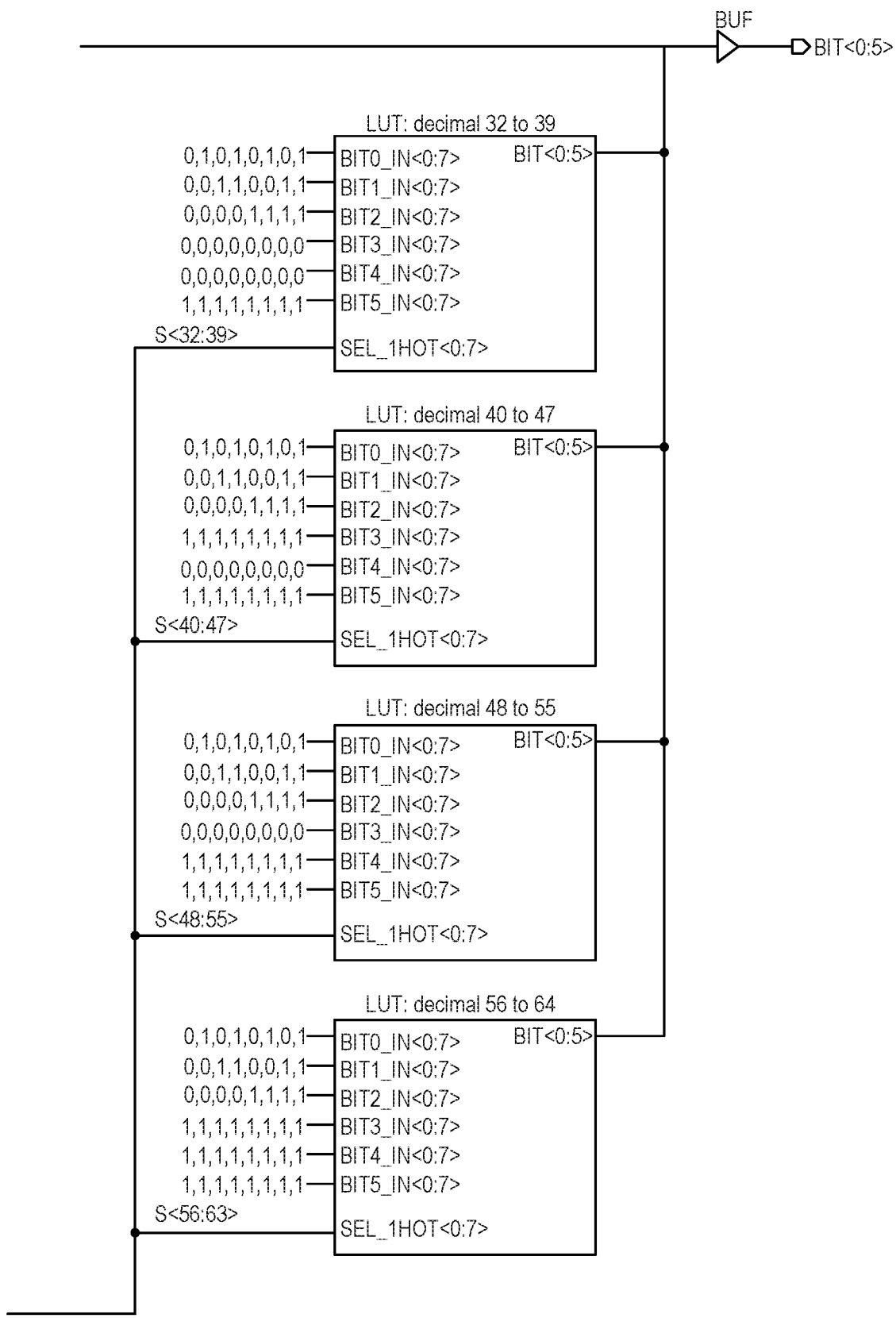

FIG. 7 illustrates a LUT used in time-based ADC according to FIG. 6 where the subtraction of the digitized (differential) input signal is performed outside the sub-ADC in the successive digital-signal processing unit so that only unsigned values need to be stored in the LUT.

FIG. 7 shows the lookup table (LUT) as it is used in the positive and negative data paths of the time-based ADC shown in FIG. 6. The right-hand side 702 of FIG. 7 shows the high-level partitioning of the LUT into 8 storage blocks where the detailed implementation of one of these blocks is depicted on the left. There are 8 blocks because the 64-bit wide 1-hot encoded address vector is subdivided into bins of 8 consecutive 8 bits (i.e., 8×8 b=64 b). The partitioning is reflected in the drawing in such a way as the 64-bit wide input address vector S<0:63> splines out into the vectors S<0:7>, S<8:15>, . . . , S<48:55>, S<56:63>, whereas each of the latter 8 vectors is fed to a separate storage block. One of these 8-bit wide address bins contains the logical 1 of the 1-hot encoded vector. The bin with the logical 1 selects its pertinent storage block from where it reads 1 out of 8 stored digital values. Each value has a resolution of 6 bits.

How this works in detail is shown in the block diagram on the left 700 of FIG. 7. From top to bottom there are 8 blocks. Each of these blocks has 8 parallel slices. Each slice contains a pass-gate that is controlled by a single bit of the 8-bit wide input address SEL_1HOT<0:7>. This address can be any of the previously mentioned addresses S<0:7> through S<56: 63>. If SEL_1HOT<0:7> is all zero, i.e., SEL_1HOT<0: 7>=b00000000, then all pass-gates of the pertinent storage block are in tri-state mode, which means that their outputs are in the high-impedance state and hence neither flag a logical 1 nor a logical 0. If SEL_1HOT<0:7> contains the logical 1 of the 1-hot encoded vector, e.g., SEL_1HOT<0: 7>=b00100000, then the third passgate (read from the left) are enabled and feed their inputs to the output while all other pass-gates remain in the high-impedance state, which means that they are disabled. The inputs of the pass-gates are the stored LUT values. Because the logical 1 in the sub-address vector SEL_1HOT<0:7> selects the input data column wise, the LUT values need to be stored in column fashion with e.g., the LSB at the top position and the MSB at the bottom as indicated by the high-lighted column at the first storage block on the right-hand side of FIG. 7.

As another example, assume that S<16:23>=b00000001 while all other 8-bit wide sub-address vectors are all zero, hence the logical 1 of the overall 1-hot encoded input vector occurs at the 24th position. In this example SEL_1HOT<0: 7> of the third storage block contains a logical 1 at the 8th position, which means that the right most pass-gates feed their inputs to the output, which then becomes b111010=dec23 (LSB is leftmost bit) as indicated by the dashed box at the 3rd memory block when reading it from top to bottom. This 6-bit wide vector is then buffered and fed to the overall LUT output that is labeled BIT<0:5> in FIG. 7.

When going back to FIG. 6 there are two LUTs (one in the positive 604 data path and one in the negative 606 data path) that both output two 6-bit wide unsigned vectors. These unsigned vectors are then subtracted on sub-rate level in the digital-signal processing unit that comes after the output demultiplexer 608 of the time-based ADC.

Figure 8:
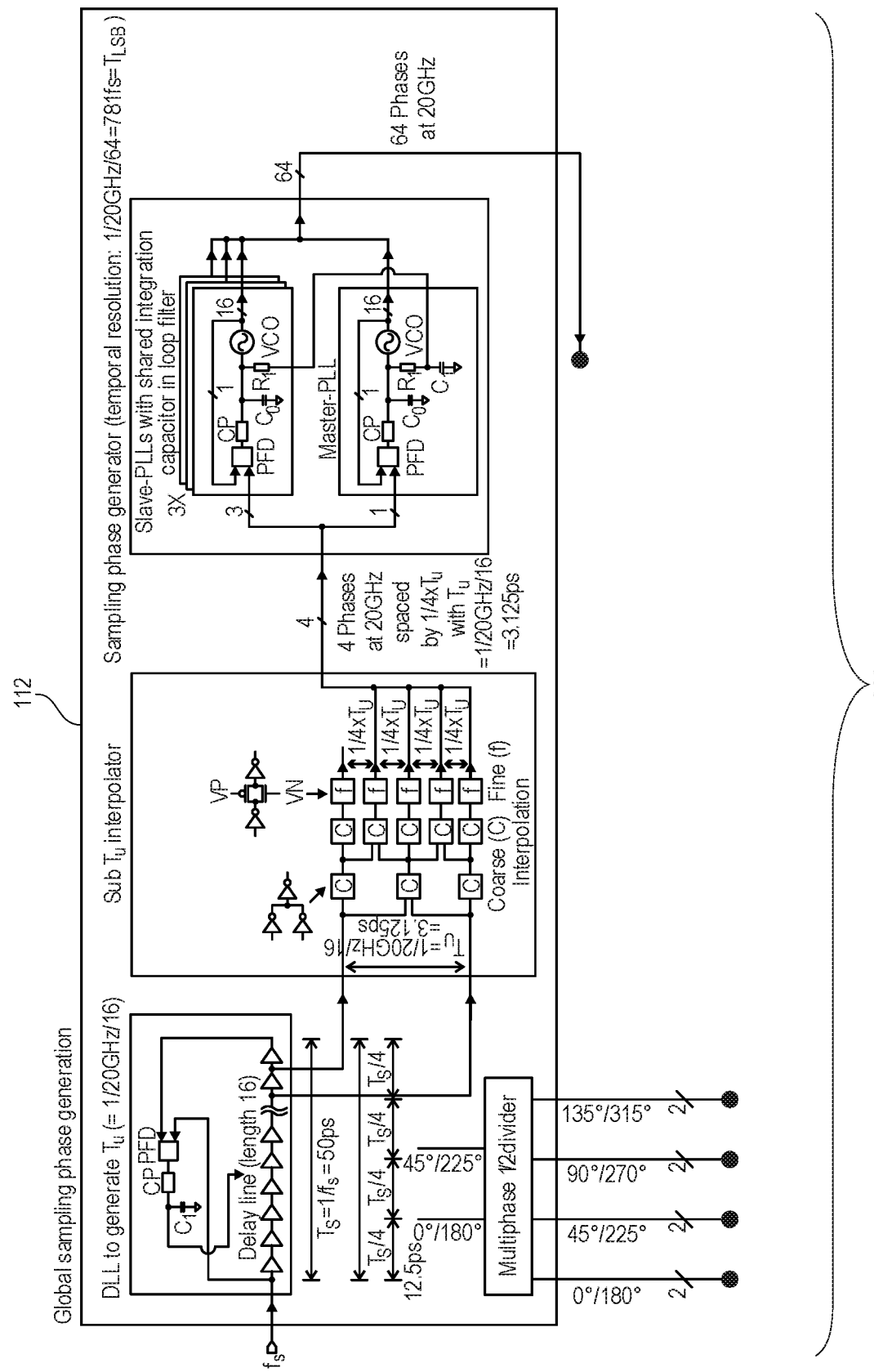
FIG. 8 illustrates a further example of an analog-to-digital converter.
Figure 8:
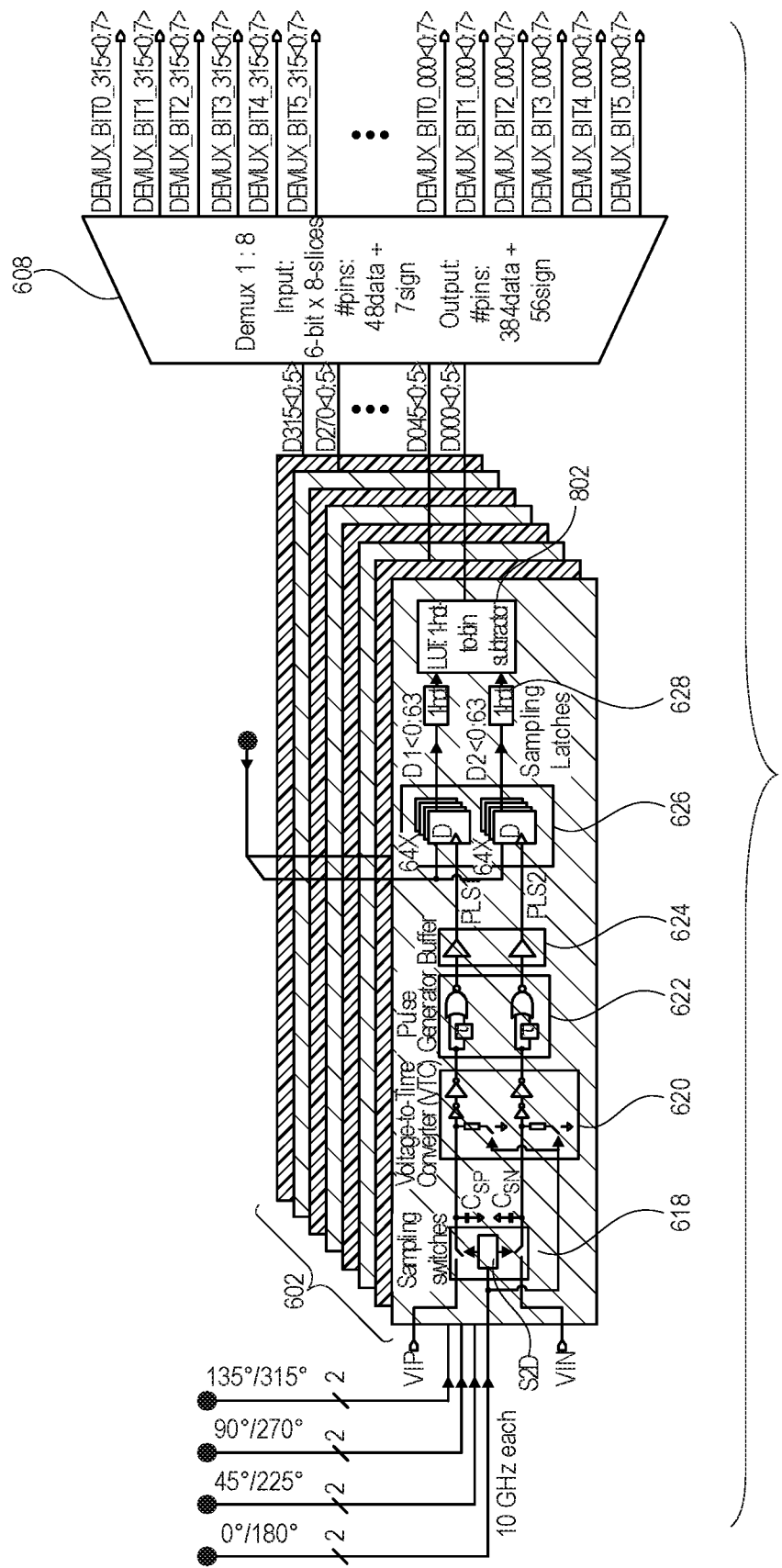

FIG. 8 illustrates a Time-based ADC 800 with 8× time-interleaved sub-ADC slices where each of them has a single LUT 802 that directly determines the subtraction of the digitized positive and negative ADC inputs within the sub-ADC slice prior to feeding the result to the demultiplexer that connects the sub-ADC slices to the successive digital-processing unit.

FIG. 8 shows the same block diagrams as the time-based ADC of FIG. 6 with the only exception that there is now a single LUT instead 802 of two separate LUTs. The single LUT shown in the sub-ADC slices of FIG. 8 directly performs the subtraction of the digitized positive and negative ADC inputs so that only half of the data need to be demultiplexed to the digital-signal processing unit, which in turn also makes it simpler as no subtraction needs to be calculated. Note that the output demultiplexer may possibly only be required if the sub-ADC slices 602 run at a higher speed than the digital-signal processing unit. If the conversion rate of the sub-ADC slices is the same as the data rate of the successive digital part that receives the digitized ADC data, then no dedicated digital-signal processing unit for reordering the ADC output is required and the sub-ADC outputs can be used directly to feed into any digital receiver that follows the time-based ADC.

Figure 9:
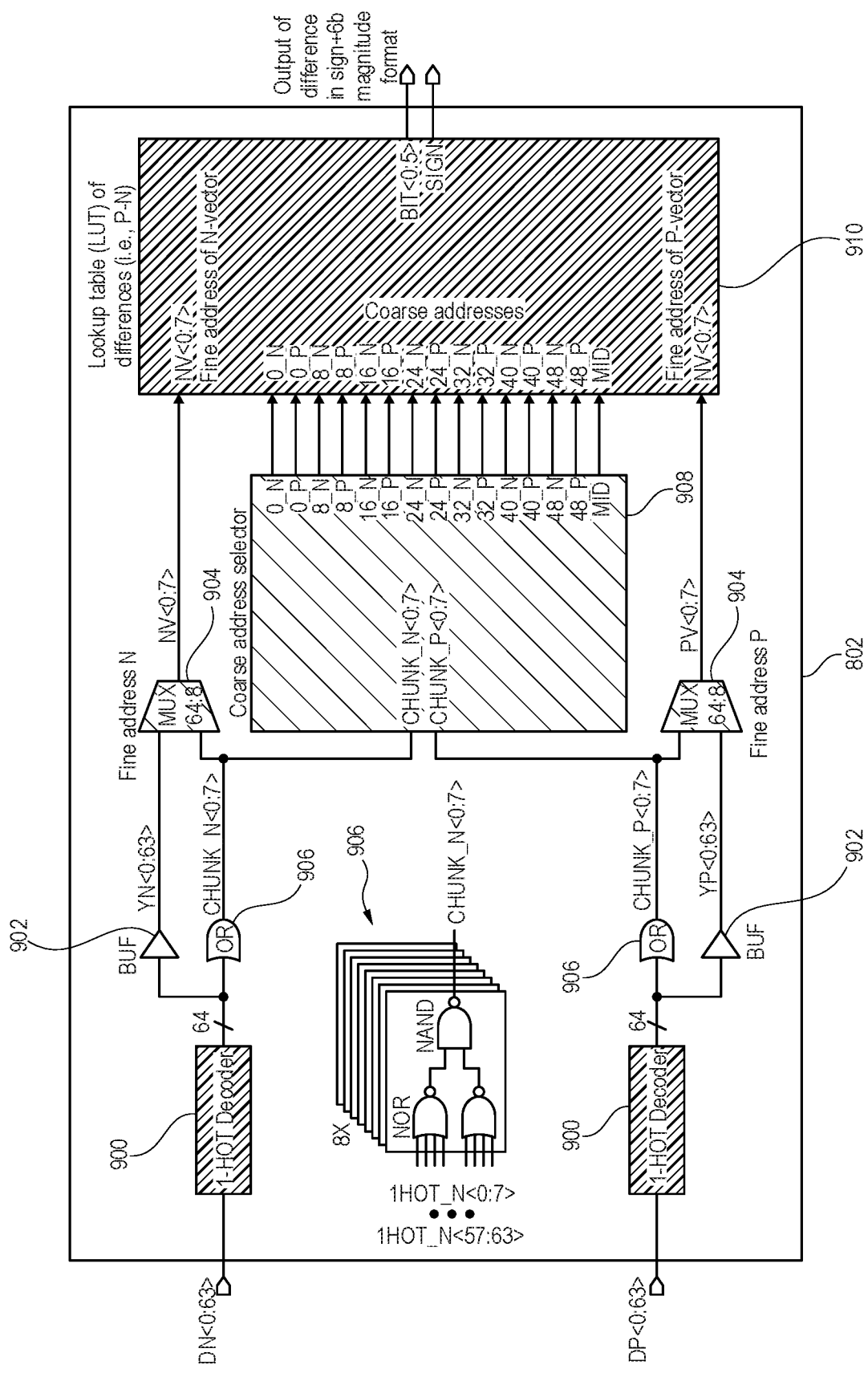
FIG. 9 illustrates an example of a lookup table address selection.

FIG. 9 shows a block diagram of the LUT 802 included in the sub-ADC slices 602 of FIG. 8 that directly determines the subtraction of the differential input by means of a row and column address provided by the two 1-hot encoded input vectors.

The value of the pertinent subtraction is read out from the LUT by means of a row and a column address derived from the 1-hot encoded vectors belonging to the positive and negative data paths. This works as follows: As illustrated in FIG. 9 the output of the 1-hot decoder blocks 900 is branched off into two paths each. In the first branch the whole 64-bit wide 1-hot encoded vector is fed via a buffer (BUF) 902 to the input of a 64:8 multiplexer (MUX 64:8) 904 whose output is the fine address of either the positive data path (PV<0:7>) or the negative data path (NV<0:7>). In the second branch the 64-bit wide 1-hot encoded vector is partitioned into consecutive 8-bit wide chunks that are fed to eight 8-way OR-gates 906. The 8-bit wide output vector of these OR-gates is the coarse address for either the positive data path (CHUNK_P<0:7>) or the negative data path (CHUNCK_N<0:7>). Due to the nature of the original 1-hot encoded vector one of the eight 8-bit wide chunks contain the logical 1 of the 64-bit wide 1-hot encoded vector fed to the input of the eight 8-way OR-gates.

A logical 1 is then generated at the output of the pertinent 8-way OR-gate and this is reflected by a single logical 1 at the pertinent position within the coarse address vectors CHUNK_P<0:7> and CHUNK_N<0:7>. The coarse addresses CHUNK_P<0:7> and CHUNK_N<0:7> are branched off into two paths. On the one hand they are fed directly to the (common) coarse address selector block 908, while on the other hand they are fed to the pertinent 64:8 multiplexer 904 in their respective data path. At the 64:8 multiplexers 904 the vectors CHUNK_P<0:7> and CHUNK_N<0:7> act as selectors to carve out the 8-bit wide sequence from the 64-bit wide 1-hot encoded vector at their input that contains the logical 1. The two 64:8 multiplexers 904 allow the carving out of the right bit sequences because the position of the singular logical 1 in the CHUNK_P<0:7> and CHUNK_N<0:7> vectors provided to their selector inputs determines in which 8-bit wide sequence of the eight 8-bit wide sequences defining the 64-bit wide 1-hot encoded vector the original logical 1 is located. The fine address vectors PV<0:7> and NV<0:7> of the two 64:8 multiplexers as well as the output of the coarse address selector block are then fed to a block called 'Lookup table (LUT) of differences (i.e., P−N)' 910 that outputs the digitized subtraction of the differential analog input signal of the time-based ADC. In this drawing the output of the LUT has a data format defined as sign bit and 6-bit magnitude but it can be any data format including the 2 s complement data representation.

The reason for partitioning the LUT address into coarse and fine addresses is to reduce the hardware complexity since looking up a single data entry from a 64 b×64 b (=4096 LUT entries) matrix is more demanding than performing this gradually by first determining an 8 b×8 b (=64 entries) sub-matrix (out of a set of 64 64 b-matrices) via the coarse addresses followed by reading out the final data from the selected 64-entry LUT by means of the fine addresses. The hierarchical partitioning into coarse and fine addresses also enables the exploitation of symmetries and commonalities in the data set of LUT entries, which then also helps reduce the overall LUT sizes as will be explained in more detail below.

Figure 10:
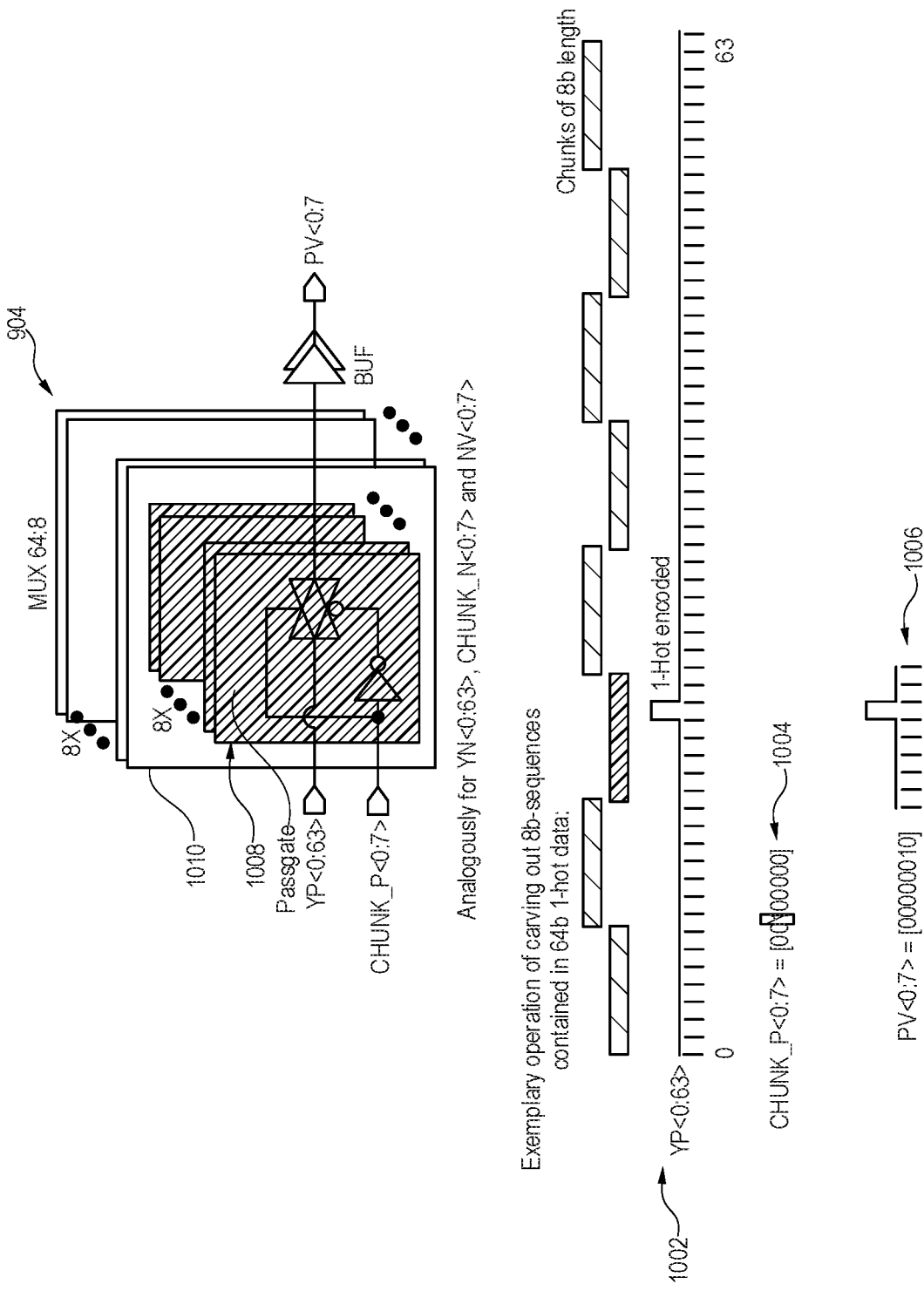
FIG. 10 shows a schematic of a 64:8 multiplexer.

FIG. 10 shows a schematic of the 64:8 multiplexer 904 with an exemplary waveform illustrating the carving out of the third 8 b sequence [00000010] out of the 64 b 1-hot data 1002 together with the pertinent coarse address vector 1004 CHUNK_P<0:7>=[00100000], which has a logical 1 at its third bit position.

The upper part of FIG. 10 shows the schematic of the 64:8 multiplexer 904 that is contained in the block diagrams of FIG. 9. Its task is to carve out the 8 b fine address vector from the 64 b 1-hot data based on the coarse address that is provided to the selector input of the multiplexer. The schematic consists of eight slices 1010 where each of them is addressed by a single bit of the coarse address vector CHUNK_P<0:7>. Each slice is composed of 8 passgates 1008. If a specific slice 1010 is enabled or selected by the logical 1 of the coarse address CHUNK_P<0:7>, all of the pertinent 8 input bits are passed through to the output of the passgates 1008. The passgates 1008 of all unselected slices are tri-stated in the high-impedance state. The successive buffers are configured such that the buffer belonging to the 1st bit of PV<0:7> has all first pass-gate outputs tied together at its input, the second buffer providing the 2nd bit of PV<0:7> buffers all second pass-gate outputs and so on, until the 8th buffer has all 8th passgate outputs at its input and provides the last bit in PV<0:7>. The described funneling of passgate outputs to the buffering of the individual bits of the fine address vector PV<0:7> is only alluded and not shown in all details in FIG. 10.

The lower part of FIG. 10 shows an exemplary waveform of the 64 b 1-hot data where the third 8 b sequence is carved out to be used as fine address for the lookup operation. The selection of that bit sequence is based on the coarse address CHUNK_P<0:7>, which has a logical 1 at its third bit position in the illustrated example. The resulting fine address is PV<0:7>=[00000010].

Figure 11:
FIG. 11 illustrates an example of a lookup table.
Figure 11:
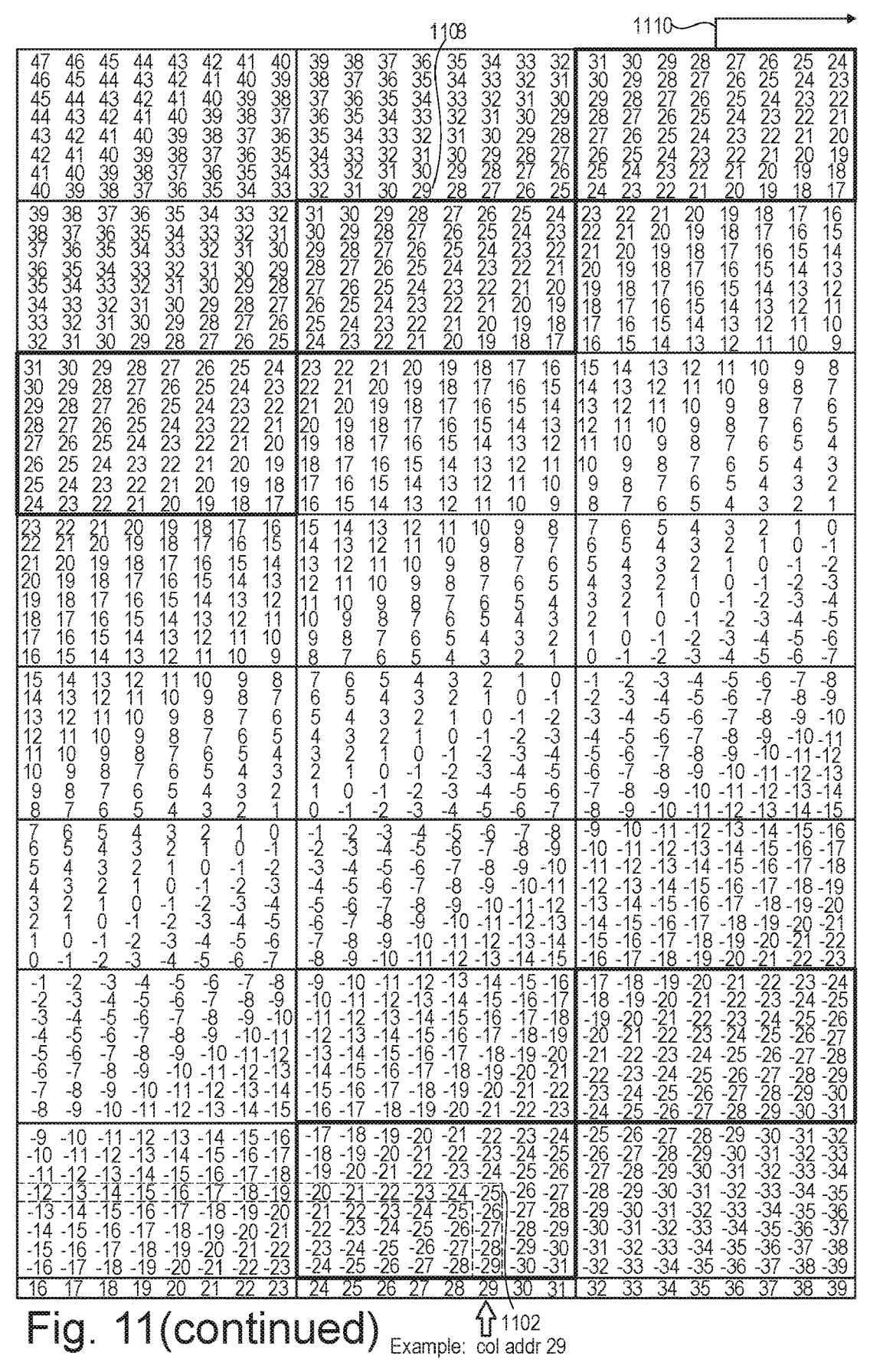
Figure 11:
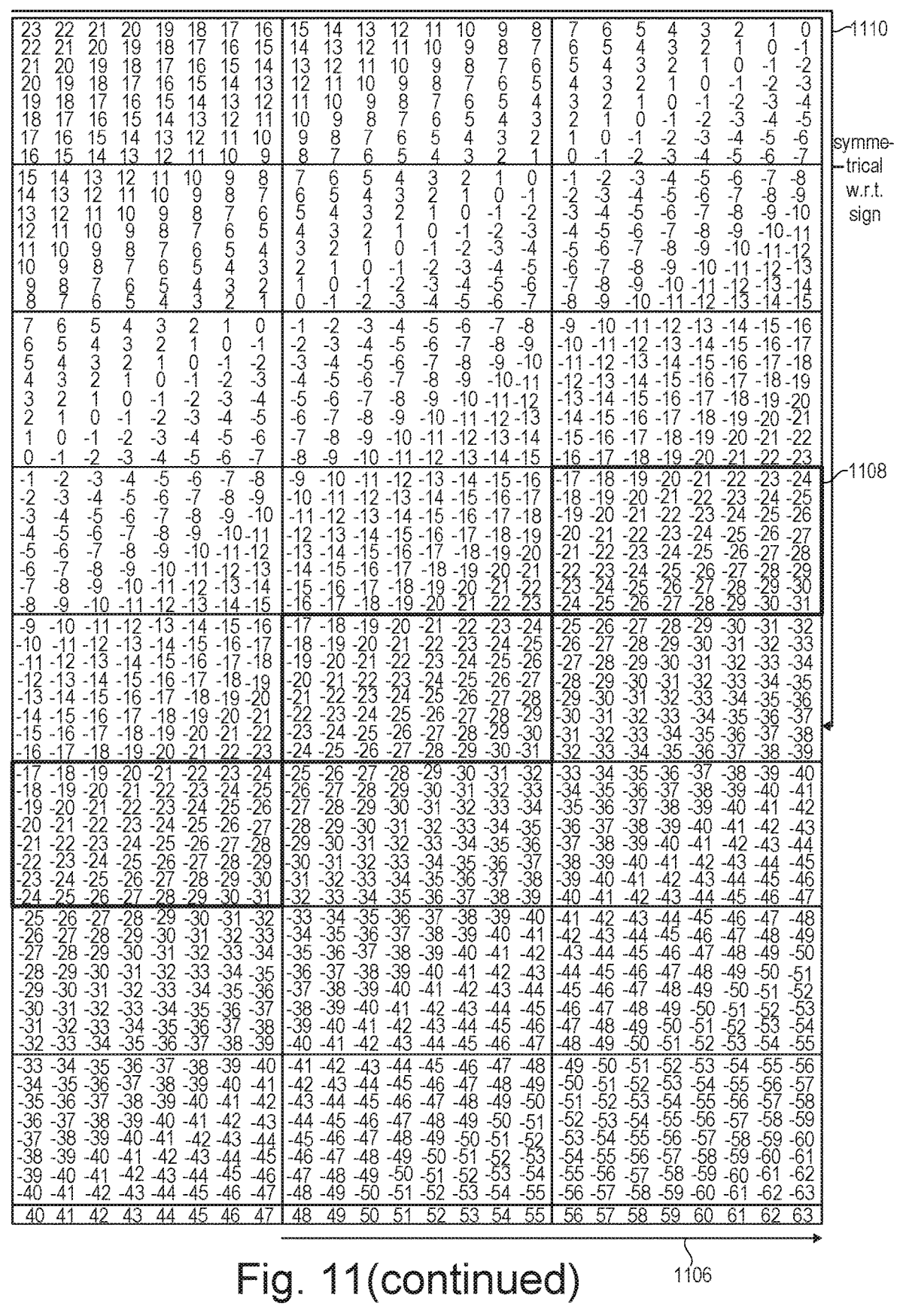

FIG. 11 shows a lookup table 1100 with 64 row and 64 column addresses storing 4096 subtraction results. The row and column addresses represent the unsigned digitized values of the positive and negative data paths of the differential ADC input signal. As an example, the subtraction of 4 minus 29 is shown 1102. The intersection of the row address 4 and the column address 29 yields the stored result, which is −25. Furthermore, it is shown by the highlighted squares that there are commonalities, i.e., identical blocks of values, along the off-diagonals, whereas there is a symmetry with respect to the sign and the main diagonal.

Before proceeding with the discussion of the implementation of the building blocks 'Coarse address selector' and 'Lookup table (LUT) of differences (i.e., P−N)' shown in FIG. 9, it might be revealing to first discuss the setup of the lookup table itself. FIG. 11 shows the LUT that stores all 4096 (=64×64) entries of a subtraction that one can get when subtracting two unsigned values ranging from 0 to 63. The two dimensions (horizontal/vertical or column/row) of the LUT corresponds to the digitized differential input signals of the time-based ADC. The value of 63 corresponds to a full-scale single-ended input of the analog signal. In FIG. 11 the vertical row direction 1104 represents the positive data path, and the horizontal column 1106 direction represents the negative data path. As an example, it is shown that the row address value 4 and the column address 29 are subtracted, which then yields the value of −25, which is stored at the intersection of these two addresses. The digitized values of the two data paths serve as row and column addresses and have the previously discussed data format of a 64 b 1-hot encoded vector each.

A closer inspection of the LUT values reveals that the 64×64 LUT can be partitioned into 64 8×8 squares. The squares along the diagonal ranging from the lower left corner to the upper right corner have the same values. On the main diagonal there are the largest number of identical squares, in total 8 identical 8×8 squares. Along the off-diagonals (ranging from lower left to upper right) the squares remain identical, but their number decreases the further away the specific off-diagonal is from the main-diagonal. This is highlighted in FIG. 11 by the bold-framed squares 1108. In the extreme case at the upper left and lower right corner there is just one 8×8 square, each with no identical counterpart. Furthermore, there is a symmetry between the off-diagonal squares that are off by the same distance from the main diagonal: The values in their pertinent squares are identical but they have a different sign. This situation is highlighted in FIG. 11 by the connected arrows around the upper right corner and the label 'symmetrical w.r.t. sign' 1110.

FIG. 12 shows an abstracted view of LUT 1100 shown in FIG. 11. There are 64 8×8 squares. Along the off-diagonals the squares are identical with respect to their entries. The dark 1200 and light grayish 1202 squares are identical along their corresponding off-diagonals, but their values differ with respect to the sign. The nomenclature 8+[0 to +15] implies that the smallest value of the specific square is 9 (=indicated value plus 1) and the values range from 9 to 23, i.e., 9+0=9 to 8+15=23.

The commonalities and differences discussed thus far can be assessed easier by abstracting FIG. 11 to the simpler configuration shown in FIG. 12. In FIG. 12 only the 64 8×8 squares are shown. Along the left and bottom edges, the coarse address vectors P<0:7> and N<0:7> are indicated. These coarse address vectors select a specific 8×8 square whereas the previously discussed fine addresses (not shown in FIG. 12) select the specific data within the selected 8×8 square. The nomenclature within the off-diagonal squares may be read as follows: For instance 8+[0:+15] implies that the smallest value occurring in the pertinent square is 9 (=indicated value+1) and the values range from 9 to 23 (=8+15).

This relationship can be verified by looking up the exact values in FIG. 11 that belong to the selected abstracted square used as an example in FIG. 12. It can also be seen in FIG. 12 that the selected square occurs 6 times along the off-diagonal and there is at the same distance from the main diagonal 1204 another off-diagonal in the lower right corner of the LUT that have the same magnitude but a different sign. From a hardware perspective this means that only one 8×8 square with the parameters 8+[0:+15] need to be stored instead of 2×6 of such 8×8 squares. This results in a significant hardware reduction. The fact that there is a symmetry with respect to the sign is indicated by the dark and light greyish coloring of the upper left and lower right halves in FIG. 12. The 8×8 squares along the main diagonal need to be treated separately since the sign symmetry occurs within themselves as there are no off-diagonal counterparts and hence the hardware for implementing those 8×8 LUT squares is different from the hardware of the off-diagonal 8×8 squares.

Figure 13:
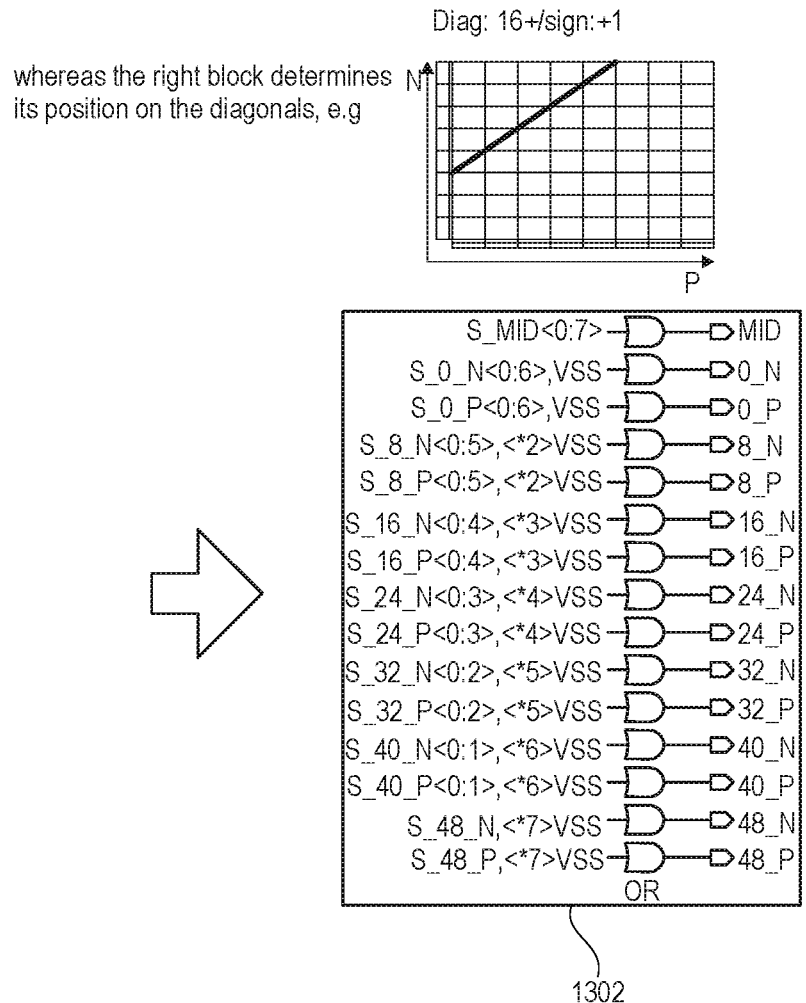
FIG. 13 illustrates the implementation of a coarse address selector.

FIG. 13. illustrates the implementation of a coarse address selector 908 of FIG. 9. The logic on the left 1300 identifies the location of the chosen 8×8 square whereas the logic on the right 1302 maps the location to the pertinent off-diagonal or the main diagonal.

The hardware implementation 908 of the coarse address selector block of FIG. 9 is shown in FIG. 13. It consists of two logic blocks as shown in the lower part of the figure. The logic on the left 1300 first determines the location of the chosen square within the LUT consisting of 64 8×8 squares. The nomenclature of the outputs of the AND-gates is chosen such that the signal name points to the set of parameters that identifies the square. For instance S_MD<0> stand for 'square (S) is located on the main diagonal (MD) at position 0' and S_24_N<2> stands for 'square (S) is located on the off-diagonal with the parameter 24+[0 to +15] on the lower right half (N) of the overall LUT'.

The logic on the right 1302 consists of OR-gates and determines whether the chosen square is located on the main diagonal or on one of the off-diagonals and if it is on an off-diagonal on which one. The nomenclature of the naming of the OR-gate output signals points to the diagonal name. For instance MD stands for 'main diagonal', 16_P stands for the 3rd off-diagonal in the upper right half of the LUT (see squares with the parameter 16+[0 +15] in FIG. 12) and 48_N stands for the square at the lower right corner of the LUT, which has the parameter 48+[0+15] with a negative sign (hence, the letter N in the signal name). The right-hand side logic helps reduce the hardware complexity because it maps the exact location of the 8×8 square to just the information on which diagonal it is located. This information is sufficient since the LUT values of the individual squares along a specific diagonal are identical and it is therefore sufficient to store just one 8×8 square per diagonal instead of many.

For instance, in case of the main diagonal (ranging from the lower left to the upper right corner of the overall LUT) the hardware saving effect is largest since only one 8×8 square needs to be implemented in hardware instead of eight 8×8 squares because they are all identical.

Figure 14:
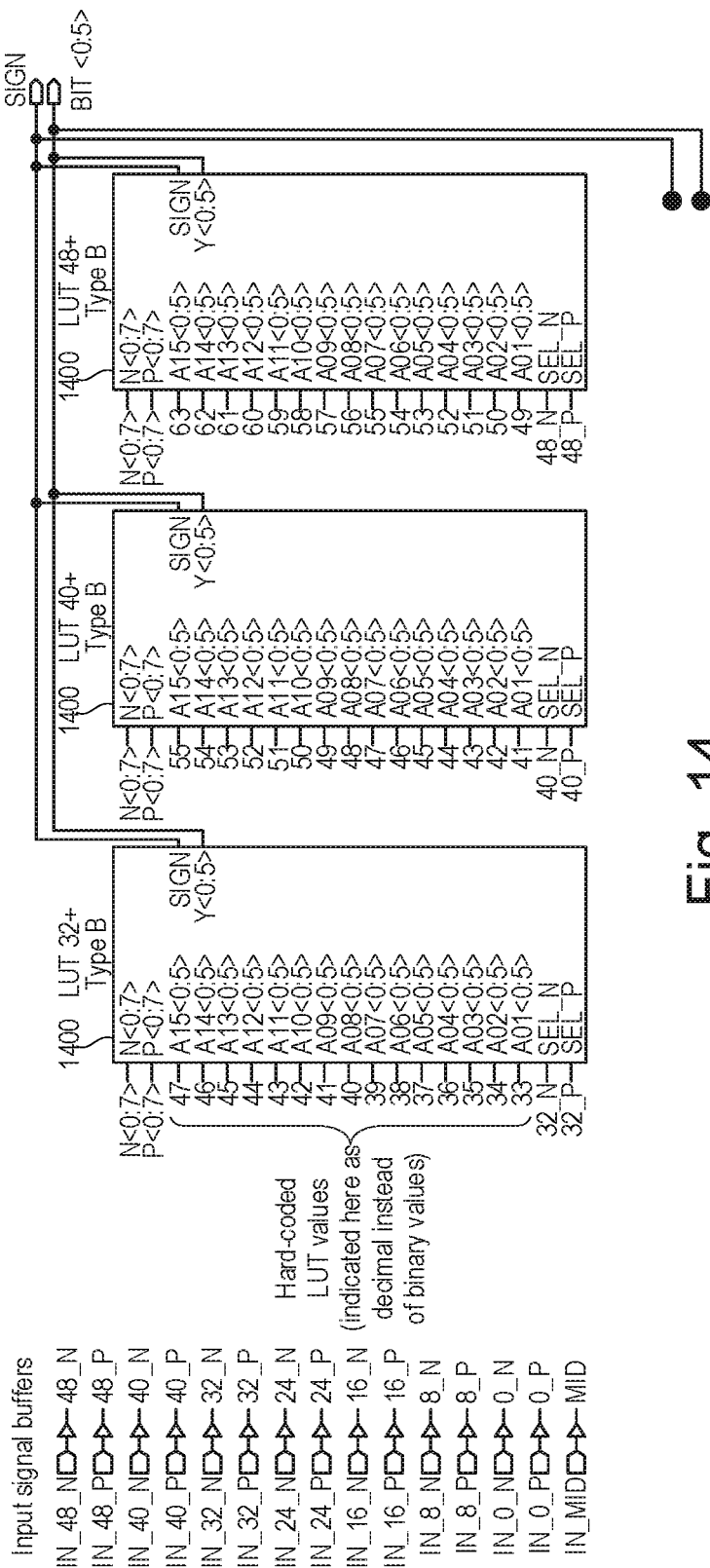
FIG. 14 illustrates an example of hard coded look up table values.
Figure 14:
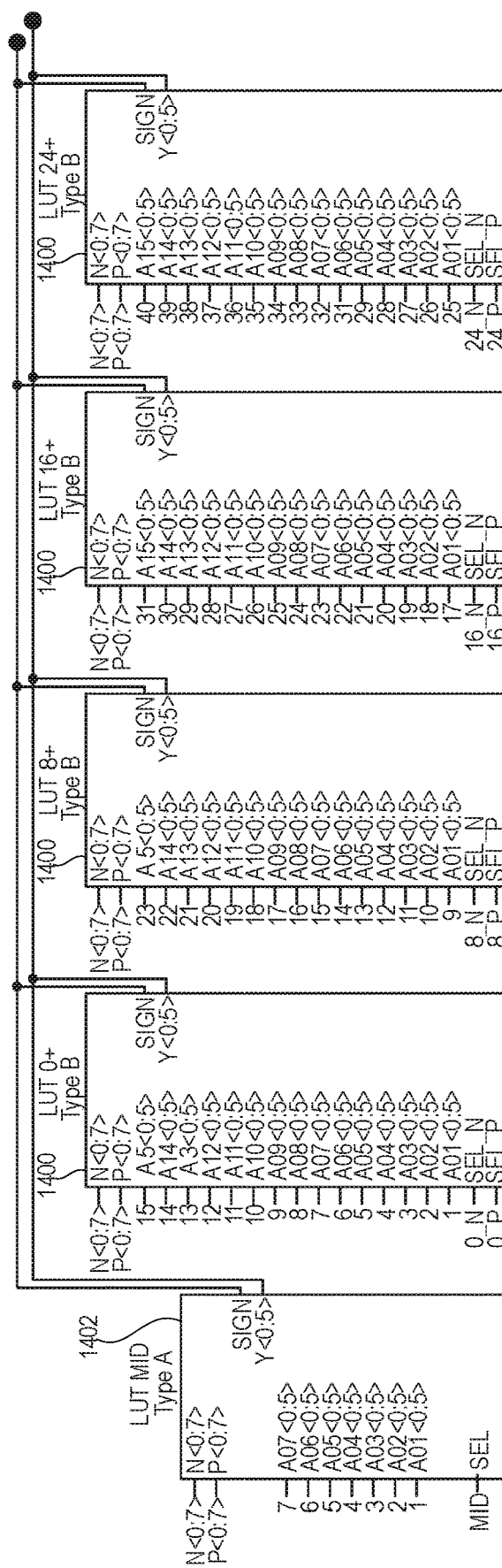

FIG. 14: shows an implementation of the block called 'Lookup table (LUT) of differences (i.e., P−N)' 910 of FIG. 9. In block 1400 there are 7 sub-LUTs for the off-diagonals and one sub-LUT in block 1402 for the main diagonal. Each of these blocks implements an 8×8 square on the pertinent diagonals shown in FIG. 12. The naming of the blocks point to the pertinent parameters, e.g., LUT40+ points to the 8×8 squares with the parameter 40+[0 to +15] in FIG. 12.

In blocks 1400 there are 7 sub-LUTs where each of them can store 16 different 6 b values, e.g. indicated by A01<0:5> in the block diagrams. All of them have as inputs the two fine address vectors P<0:7> and N<0:7> that select one out of the 16 stored values A01<05> through A15<0:5>. The selected data is then fed to the common output, which is called SIGN and Y<0:5> because the data format is sign/magnitude in this exemplary drawing. In case of a 2 s complement data format the output would be Y<0:6> for a 7-bit resolution. In block 1402 there is the pertinent LUT for the main diagonal elements.

There are only 7 inputs (A01<0:5> through A<07<0:5>) because the parameter set of the main diagonal is [−7 to +7] instead of [0 to +15] as for the off-diagonals. The symmetry with respect to the sign occurs for the main diagonal within its 8×8 square and that is the reason why fewer numbers might be stored in the main diagonal sub-LUT. The eight different sub-LUTs are selected by the modified coarse addresses MD, 0_P/0_N through 48_P/48_N generated by the logic depicted in FIG. 13. The nomenclature of these control signals is chosen such that their names point to the parameter set of the chosen sub-LUT. For instance the control signals 8_P and 8_N select the sub-LUT 8+ because its parameter set is 8+[0 to +15] as shown in FIG. 12 when looking at the second off-diagonals.

For a more concise distinction the block 1402 is a sub-LUT in FIG. 14 that belongs to the main diagonal is referred to as Type A and the block 1400 are sub-LUTS in FIG. 14 that belong to the off-diagonals are referred to as Type B.

The remainder of the description focuses on the implementation of the Type A 1402 and Type B 1400 sub-LUTs for the two data formats sign/magnitude and 2 s complement.

Figure 15:
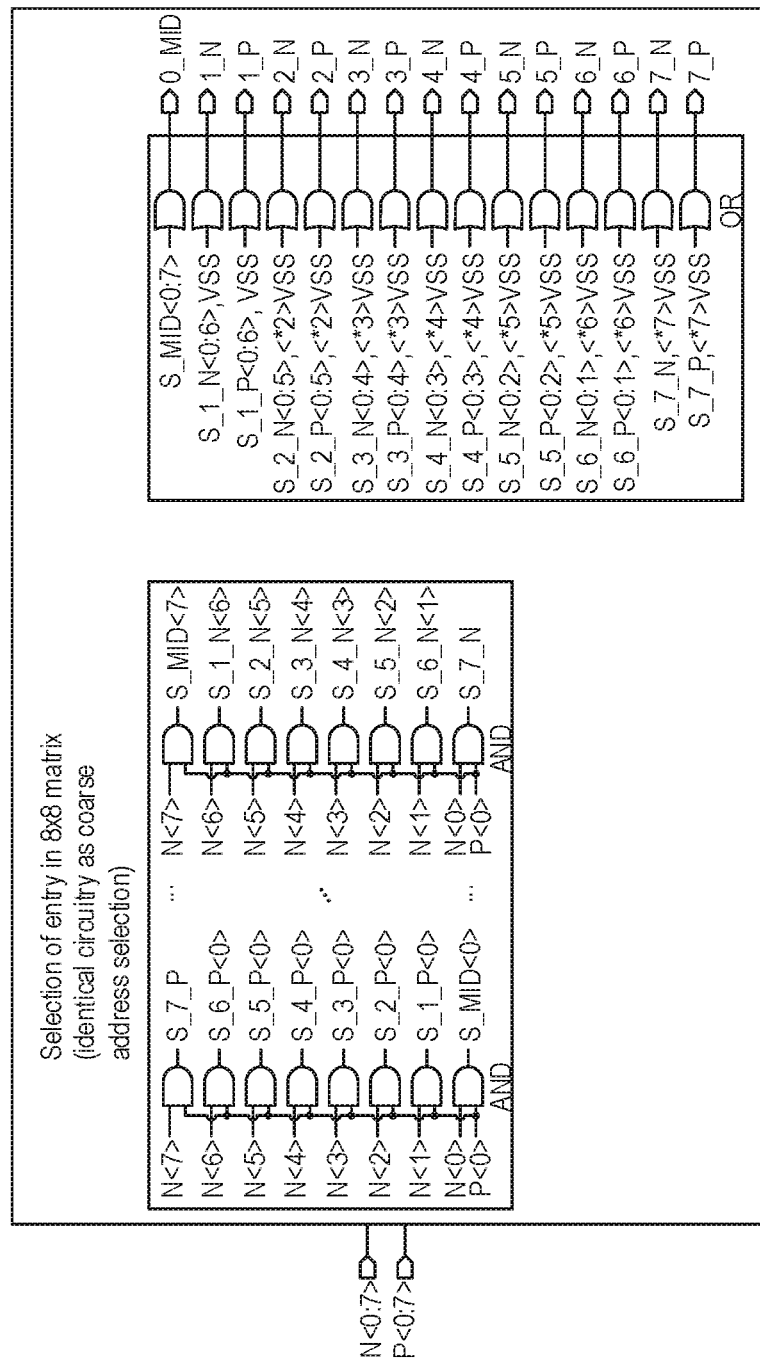
FIG. 15 illustrates an example of a look up table for a main diagonal location.
Figure 15:
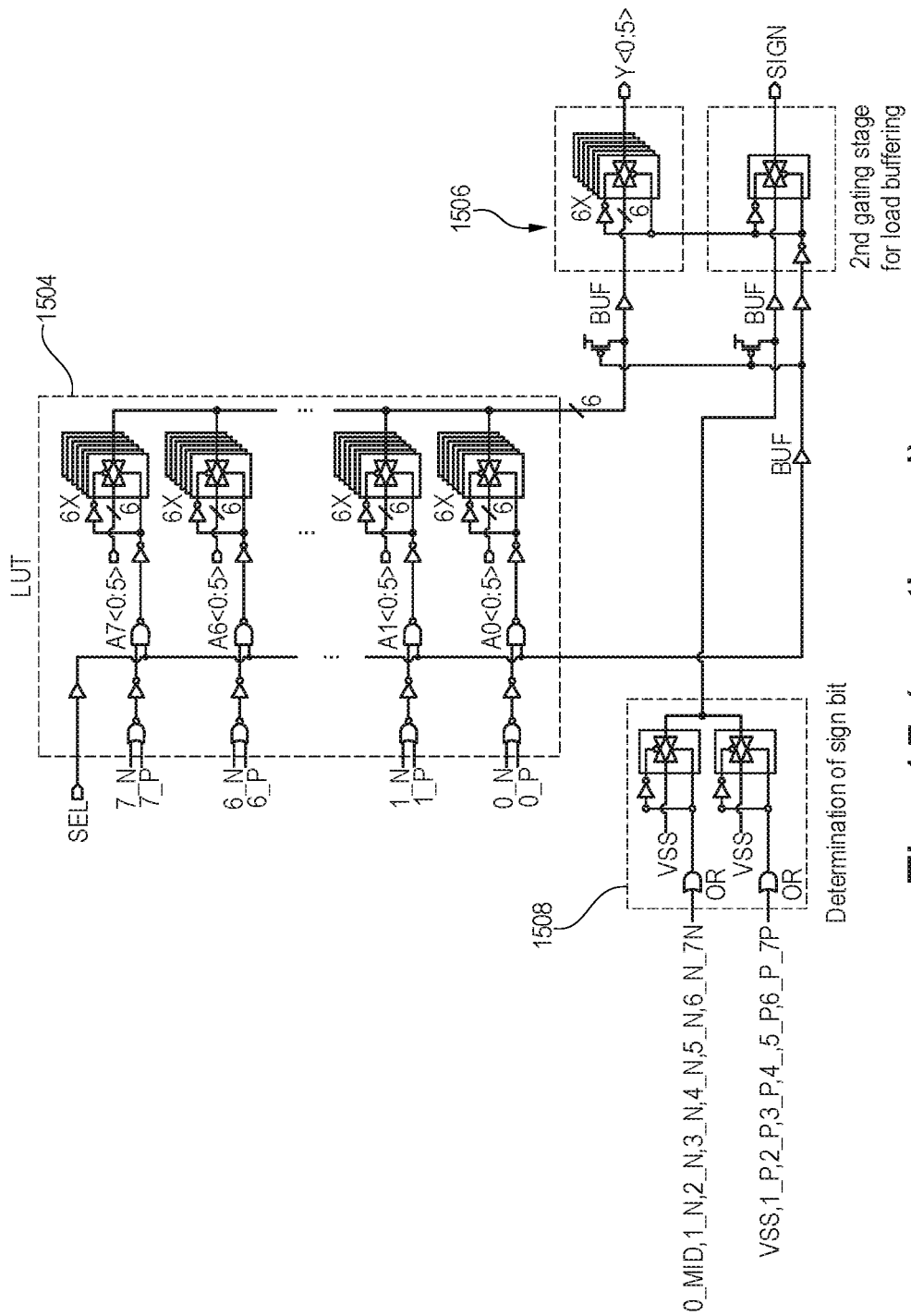

FIG. 15 illustrates a Type A LUT 1402 for main diagonal location (parameter set [−7 to +7]) in sign/magnitude data format.

The implementation of the sub-LUT 1502 for the 8×8 squares on the main diagonal is shown in FIG. 15. In a first step the fine address vectors P<0:7> and N<0:7> is fed to the logic encircled by a box 1500 on the left of FIG. 15 that is topologically identical to the coarse address selector shown in FIG. 13. It maps the input vectors to the control signals 0_MD, 1_P/N, . . . , 7_P/N that control the passgates 1504 shown on the right of FIG. 15. The inputs of the pass-gates, e.g., A6<0:5>, are the stored values that represent the subtraction of the differential input signal of the time-based ADC. For instance, if the control signal 7_N is logical 1 and all other control signals are logical 0, then the stored value A7<0:5> is fed to the output of the LUT if it is selected by the signal SEL, which corresponds to the selector signal MD shown in FIG. 14.

There is another block 1506 with pass-gates and preceding buffer before the data A7<0:5> is fed to the output Y<0:5> that represents the magnitude of the difference of the differential ADC input. This last section 1506 is only used to increase the drive strength of the signal since all the other deselected sub-LUTs are connected to the same output signals Y<0:5> and provide a significant capacitive loading that may be driven the active sub-LUT. From a pure logical perspective this last section may not be required as it acts only as tristatable buffer to improve the signal integrity. In the middle towards the bottom there is a building block 1508 that determines the sign of the data to be read out.

If the postfix of the asserted control signal is '*_N', a logical 0 (representing −1) is fed to the sign output. If the postfix of the asserted control signal is '*_P' or if the asserted control signal is 0_MID (indicating that the difference is 0), a logical 1 (representing +1) is fed to the sign output. The OR-gates in the block that determines the sign bit has 8 inputs (either 0_MID, 1_N, 2_N, 3_N, 4_N, 5_N, 6_N, 7_N or VSS, 1_P, 2_P, 3_P, 4_P, 5_P, 6_P, 7_P) because there are 8 positive value (including the value 0) and 7 negative values within the range of [−7 to +7] (see values in 8×8 square on main diagonal in FIGS. 11 and 12). The 1st input of the lower OR-gate is tied to VSS (=ground) because it is unused.

Figure 16:
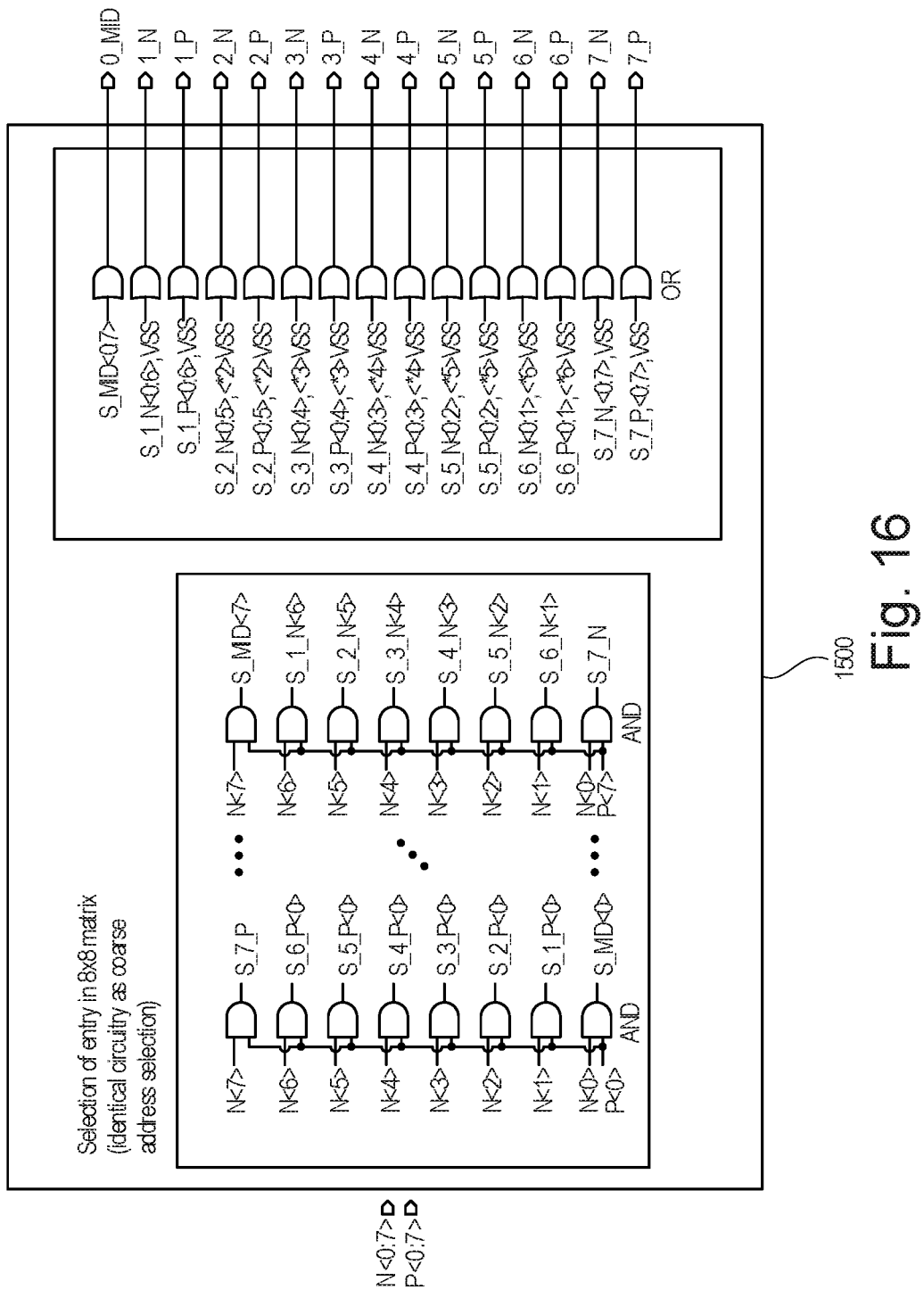
FIG. 16 illustrates an implementation of a fine look up table for a main diagonal location.
Figure 16:
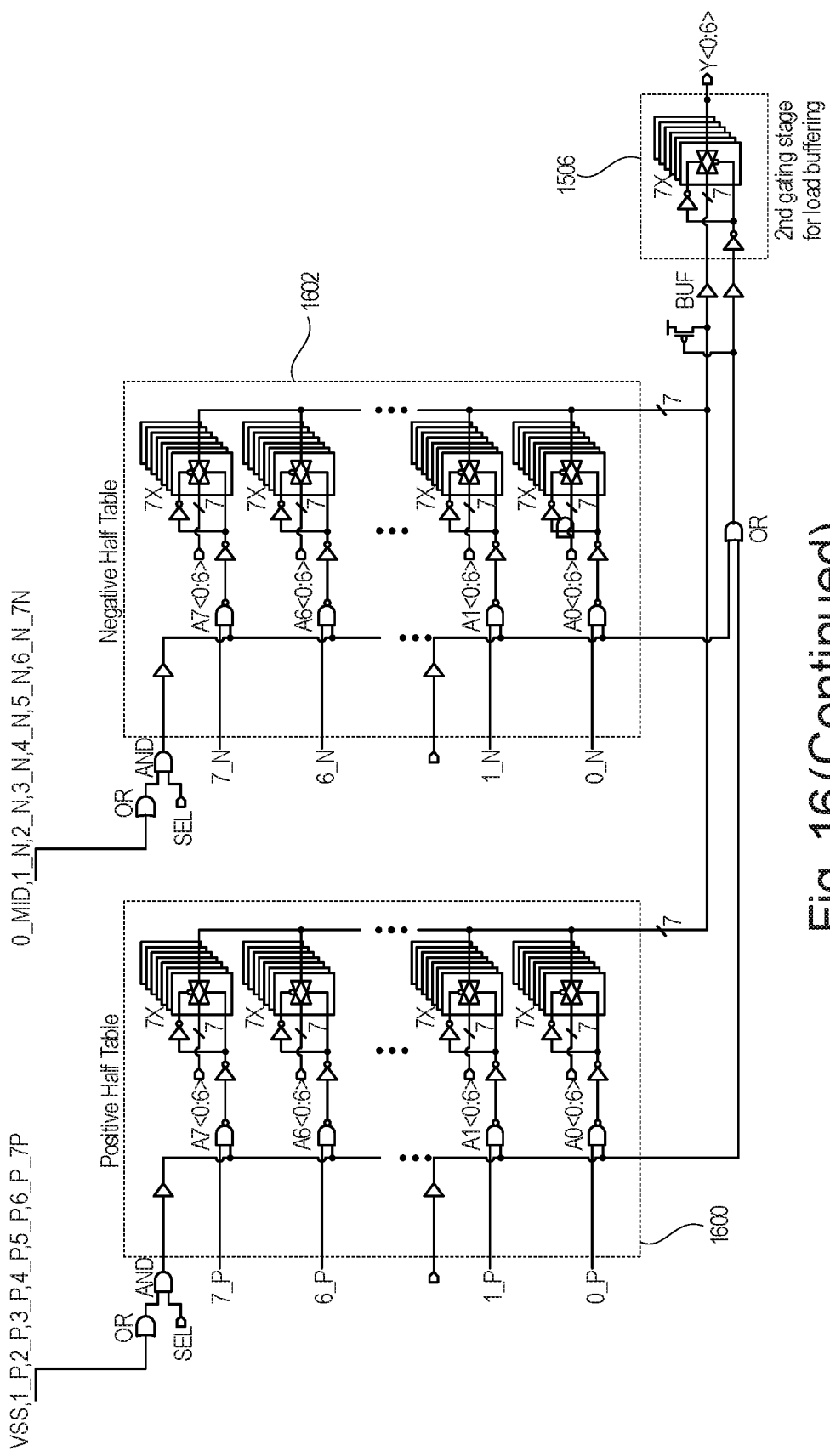

FIG. 16: illustrates an implementation of a Type A LUT 1402 for main diagonal location (parameter set [−7 to +7]) in 2 s complement data format. The conversion of the fine address vectors P<0:7> and N<0:7> into the control signals 0_MD, 1_P/N, . . . , 7_P/N is identical to the implementation for the sign/magnitude data format of FIG. 15. However, afterwards the control signals are branched off to two LUTs that are labeled 'Positive Half Table' 1600 and 'Negative Half Table' 1602 according to the two ranges of values [−7 to −1] and [0 to +7]. For instance, if the control signal N_1 is asserted and the SEL-signal is also logical 1, then the pertinent stored value A1<0:6> in the 'Negative Half Table' 1602 is fed (after some buffering) to the output Y<0:6>. The output Y<0:6> is in 2 s complement data format because the data to be read is also stored in 2 s complement format at A1<0:6>.

Two different tables are used because the bit patterns in 2 s complement format differ between a positive and a negative number and there is not just a single different bit (namely the sign bit) as in the case of the sign/magnitude data format. For instance, for a 7-bit resolution, the number +23 is b1110100 (with the LSB on the left) in 2 s complement format, while −23 is 1001011 in 2 s complement format. In the sign/magnitude format the two numbers are sign=1, magnitude=b111010 for +23 and sign=0, magnitude=b111010 for −23, hence the magnitude part of the data does not change in terms of bit pattern.

Figure 17:
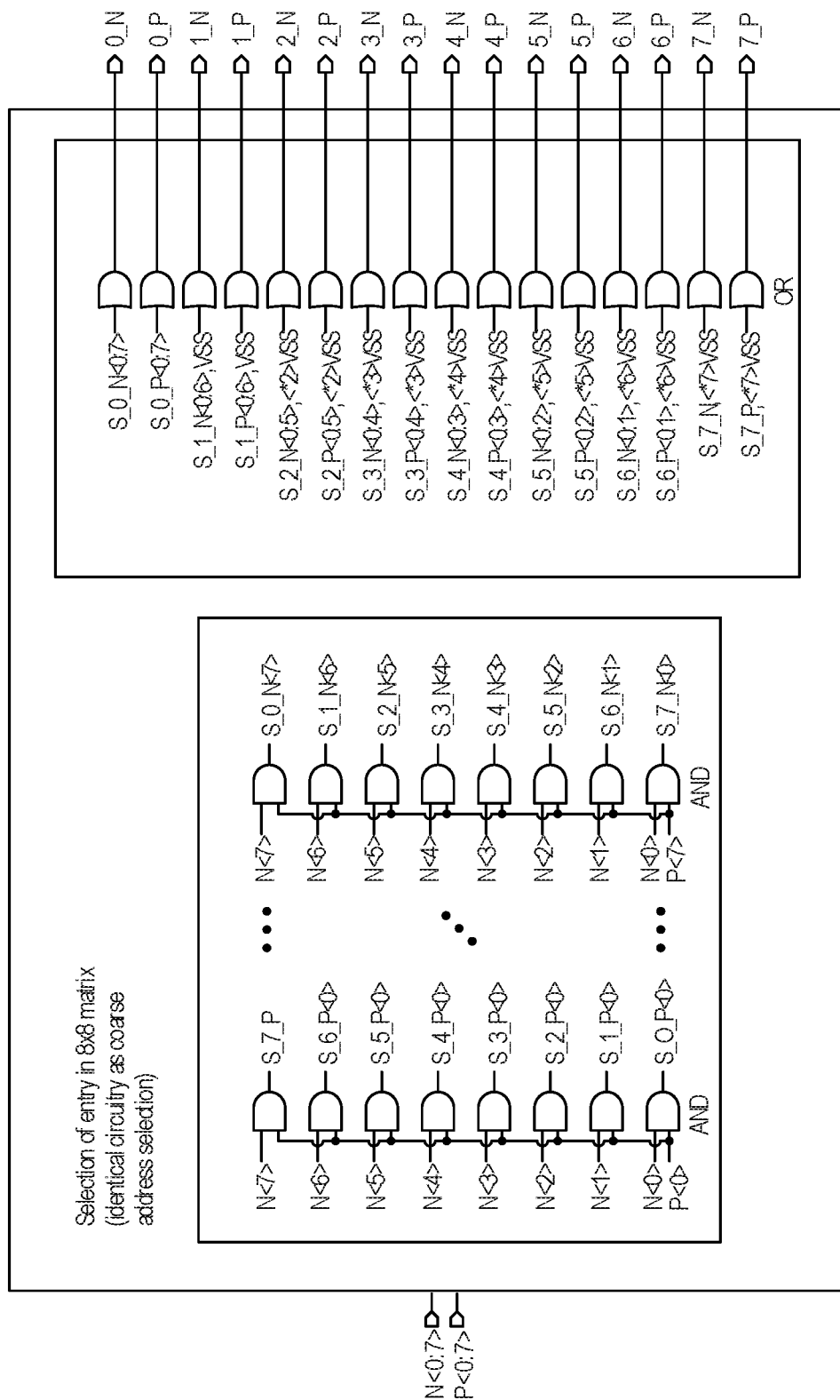
FIG. 17 illustrates an implement of a fine look up table for an off-diagonal location.
Figure 17:
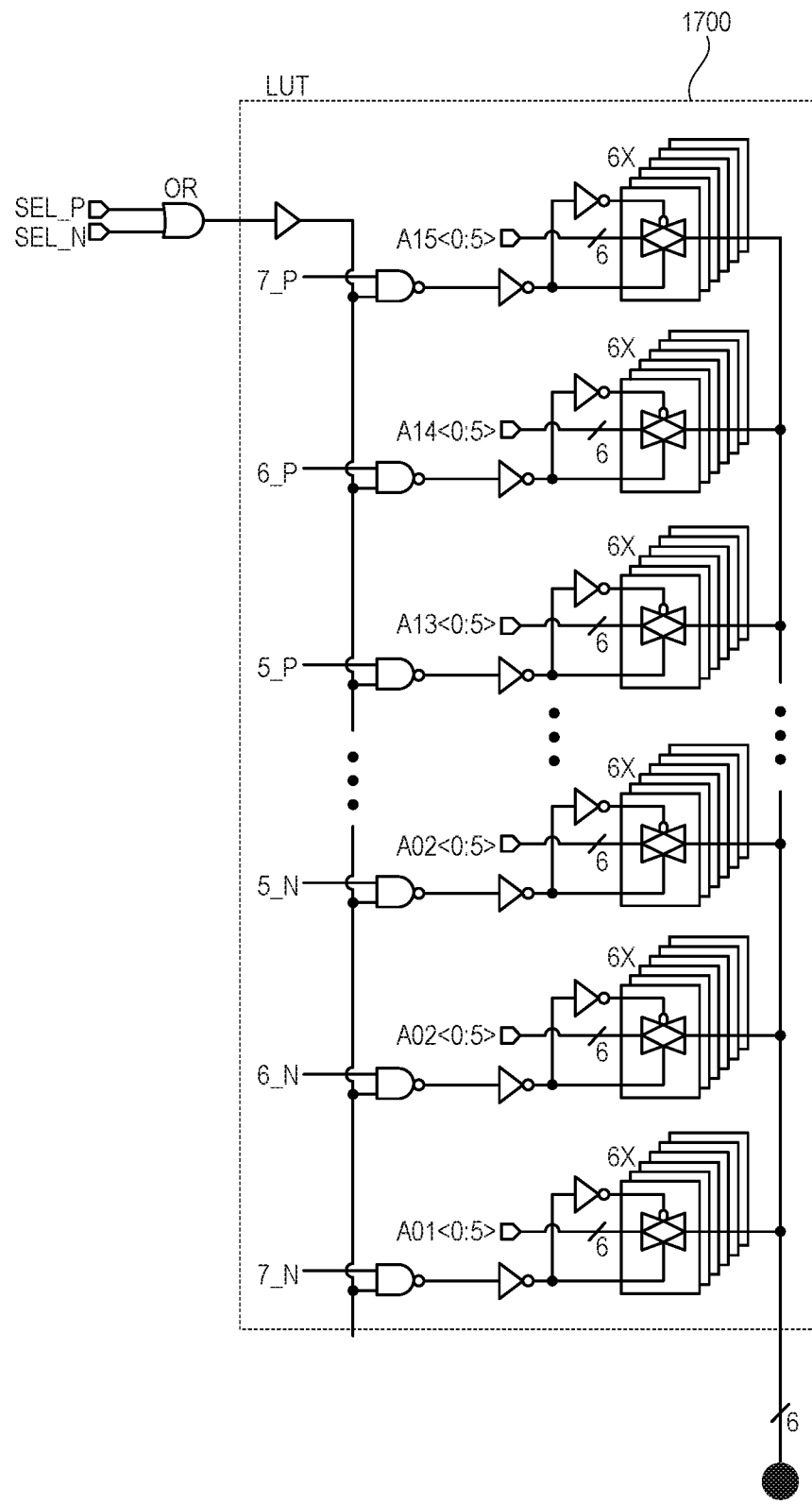
Figure 17:
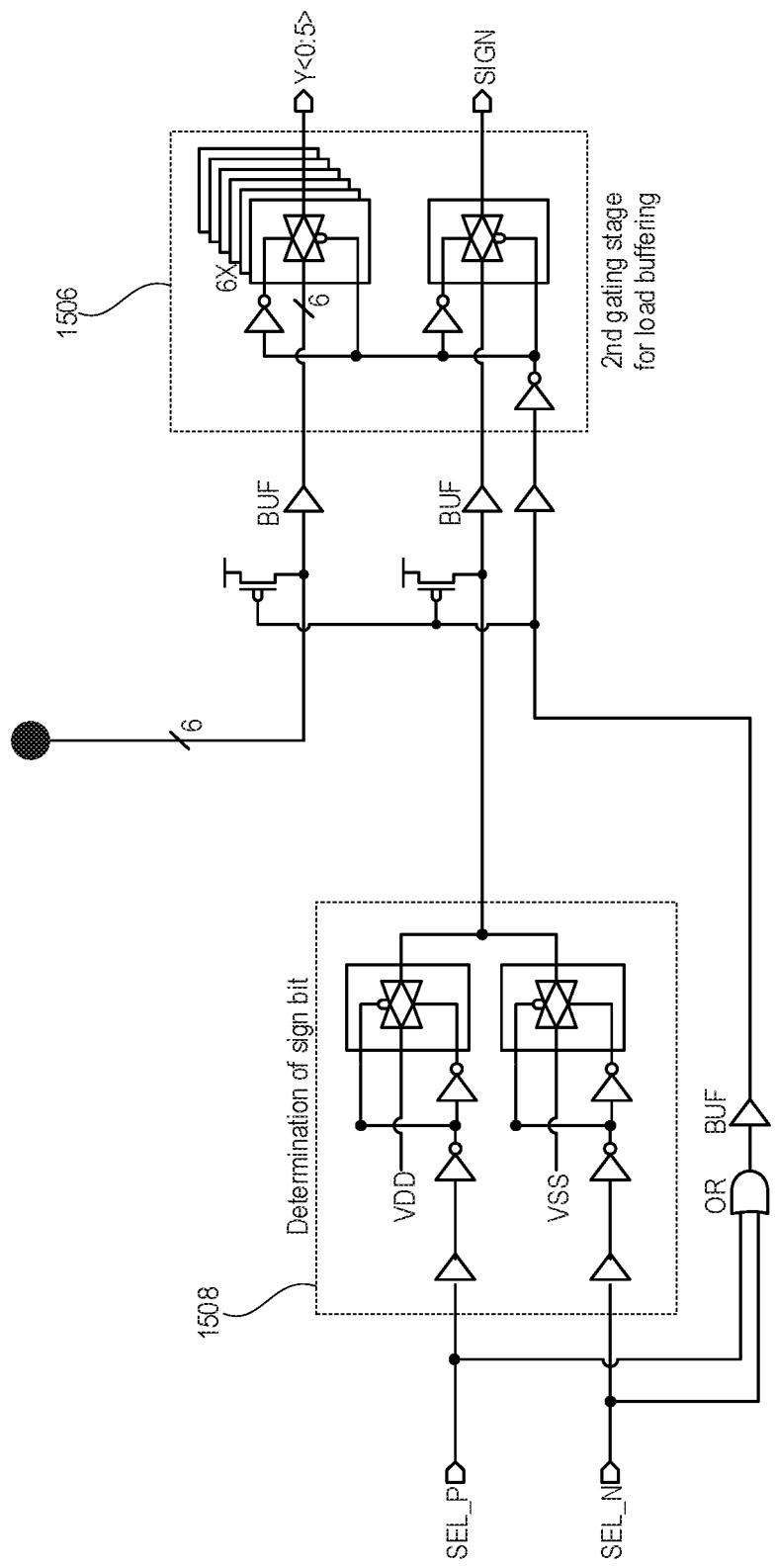
Figure 18:
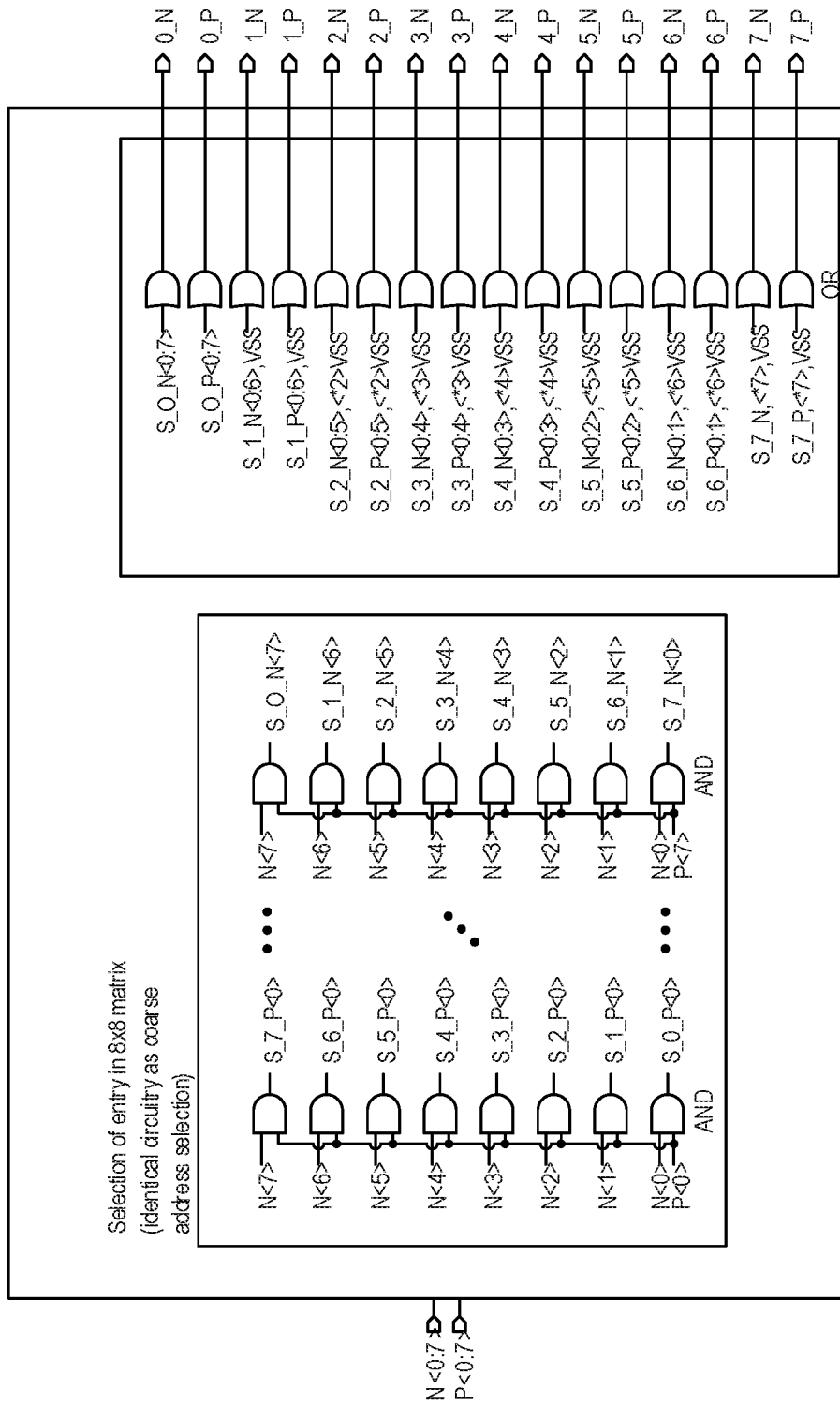
FIG. 18 illustrates an implementation of a fine look up table for an off-diagonal location.
Figure 18:
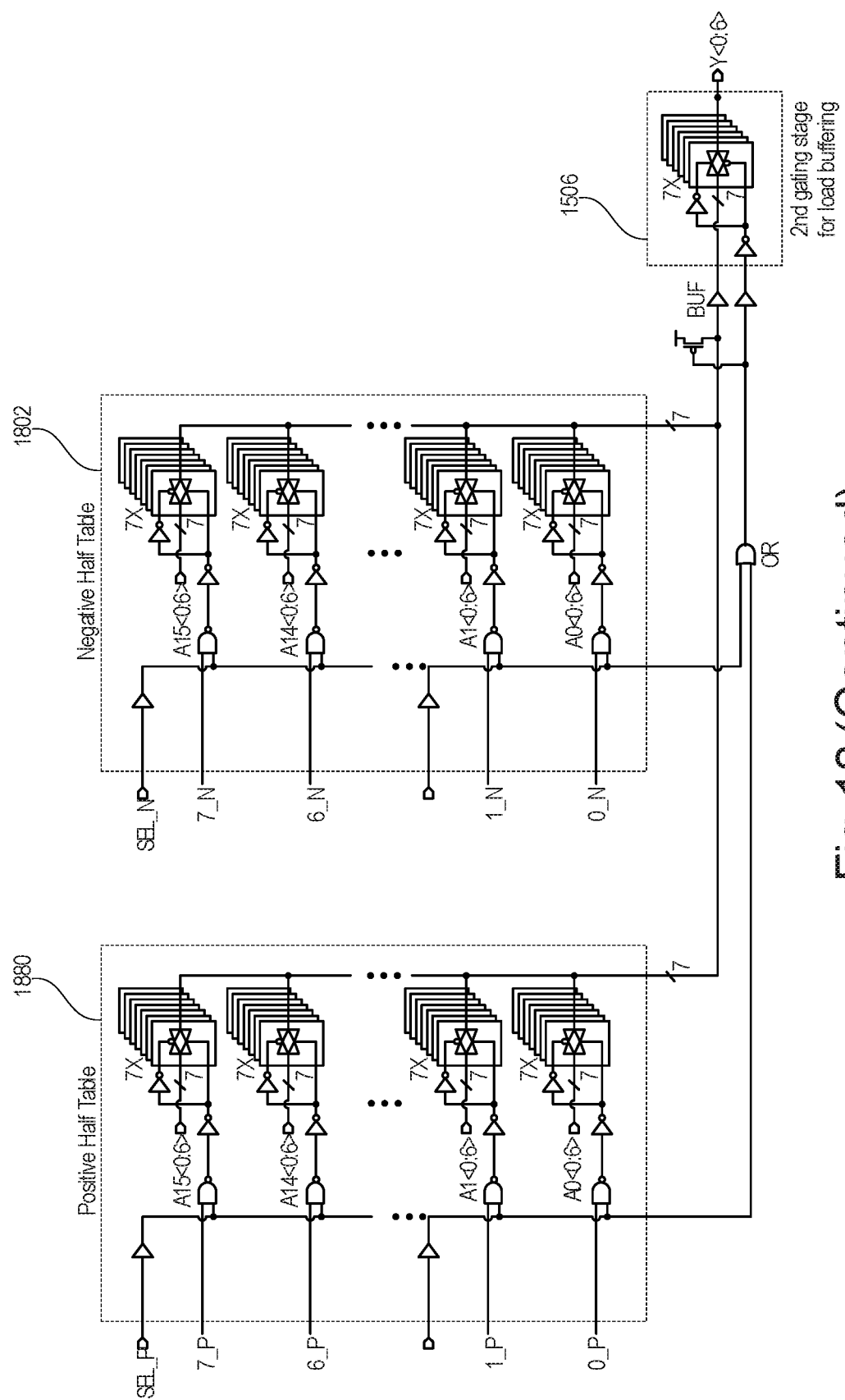

The implementations of the sub-LUTs for the 8×8 squares that are located on the off diagonals for the two data formats sign/magnitude and 2 s complement are shown in FIGS. 17 and 18.

FIG. 17 illustrates an implementation of a Type B LUT 1400 for off diagonal location (parameter set 0+[0 to +15] through 48+[0 to +15]) in sign/magnitude data format. Compared to FIGS. 15 and 16 the logic that maps the fine address vectors P<0:7> and N<0:7> to the control signals 0_P/N through 7_P/N is slightly different. The difference is related to the S_MID versus S_0 processing. While there is a sign change within the 8×8 squares located on the main diagonal, the corresponding 8×8 squares on the off-diagonals do not have a sign change within themselves. Consequently S_MID is replaced by S_0 and it is treated by the logic the same way as all other control signals S_1 through S_7. Like the main diagonal implementation there is also for the off-diagonal implementation a single LUT 1700 that now consists of 15 instead of only 8 entries.

The 15 entries are the stored values according to the parameters indicated in FIG. 12. For instance for the 1st off-diagonal the parameter is 0+[0 to +15] and hence the pertinent sub-LUT entries range from 1 to 15 as can be seen in FIG. 11. For the 2nd off-diagonal with the parameter 8+[0 to +15] the range is from 9 to 23, and so on until the 7th off-diagonal where the parameter is 48+[0 to +15] and the stored values range from 49 to 63 (see FIG. 11).

Because there is no sign change within the 8×8 squares located on the off-diagonals, the calculation of the sign bit is also slightly different between FIGS. 15 and 17. While in FIG. 15 it was used to combine all postfixes having *_N and *_P separately with OR-gates, the sign determination in FIG. 17 is based on using just the pertinent coarse address selector, which is either SEL_P for the selection of the positive sign or SEL_N for the selection of the negative sign. For instance, if the coarse address 40_N in FIG. 14 is asserted, SEL_N in FIG. 17 becomes logical 1 (under the assumption that the sub-LUT belonging to the parameter 40+[0 to +15] is selected) and outputs a logical 0 at the SIGN output (to indicate a negative sign).

FIG. 18 illustrates a Type B LUT 1400 for off diagonal location (parameter set 0+[0 to +15] through 48+[0 to +15]) in 2 s complement data format.

FIG. 18 shows the implementation of the off-diagonal sub-LUT representing the 8×8 squares of FIG. 12 in 2 s complement data format. The mapping of the fine address vectors P<0:7> and N<0:7> to the control signals 0_P/N through 7_P/N is the same as shown FIG. 17. Because of the different bit patterns in 2 s complement format a 'Positive Half Table' 1800 and a 'Negative Half Table' 1802 are implemented, analogously to the main diagonal implementation shown in FIG. 16. The only difference is that in FIG. 18 there are 15 stored values according to A0<0:6> through A15<0:6>. Depending on whether SEL_P or SEL_N is asserted, either the positive or the negative stored value in 2 s complement format is output. Note that SEL_P and SEL_N correspond to the pertinent coarse address selectors of the corresponding sub-LUT. For instance, if 16_P in FIG. 14 is asserted, SEL_P in FIG. 18 becomes logical 1 and outputs the 2 s complement value selected by the fine address vectors P<0:7> and N<0:7> from the 'Positive Half Table' 1800.

Figure 19:
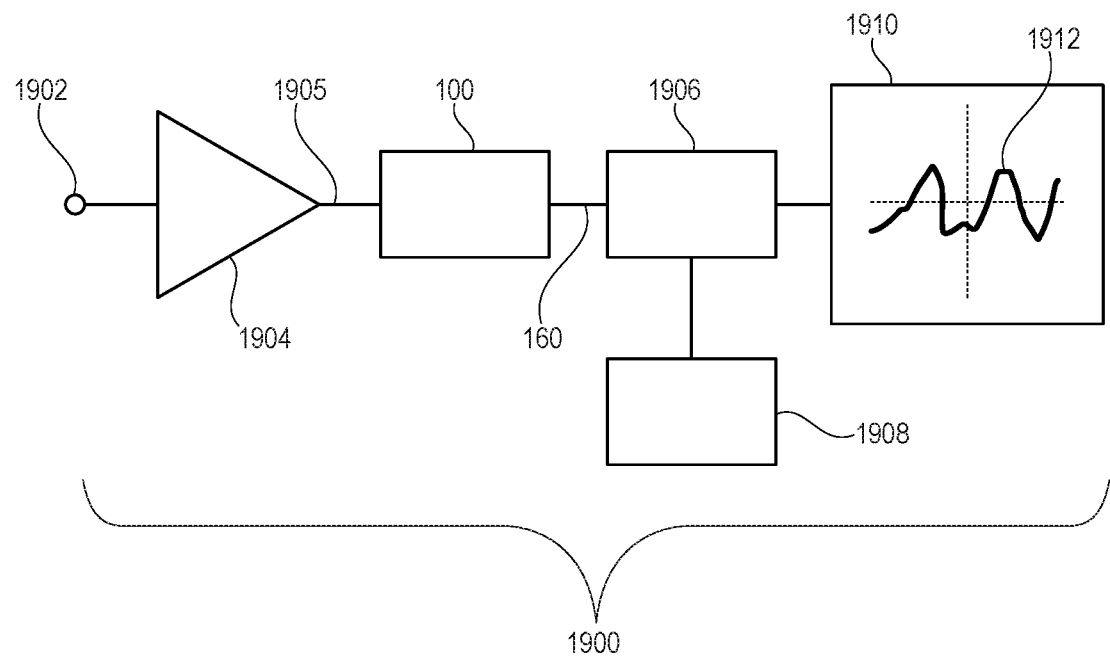
FIG. 19 illustrates an example of a digital sampling oscilloscope.

FIG. 19 illustrates a functional diagram of a digital sampling oscilloscope 1900. The digital sampling oscilloscope 1900 has an input 1902 which is then connected to a signal processing unit 1904 which may provide for such things as amplification and/or filtering of the input 1902. The output of the signal processing device 1904 is considered the analog input signal 1905 which is then fed to the analog-to-digital converter circuit 100. The output 160 of the analog-to-digital converter circuit 100 is connected for example to a computational device 1906. The computational device 1906 is connected to a user interface 1908 which enables a user to control the operation and function of the digital sampling oscilloscope 1900. The computational device 1906 also controls a display 1910 which displays a representation 1912 of the analog input signal 1905.

Figure 20:
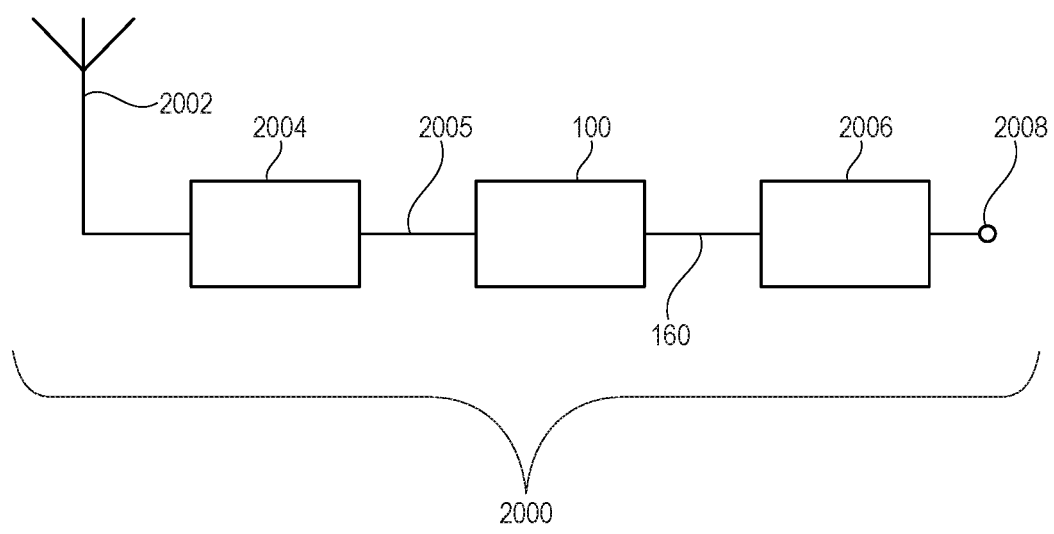
FIG. 20 illustrates an example of a telecommunications receiver circuit.

FIG. 20 illustrates an example of a telecommunications receiver circuit 2000. This is shown as comprising an antenna 2002 which is connected to a signal conditioning circuit 2004. This may contain such things as filtering, amplification or even a matching network. The output of the signal conditioning circuit 2004 is considered the input signal 2005 which is then fed to the analog-to-digital converter circuit 100. The digitized signal which comes out of the analog-to-digital converter circuit 100 is fed to a DSP system 2006 for processing. The DSP system 2006 outputs a communication signal 2008.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An analog-to-digital converter (ADC) circuit configured for digitizing an analog input signal, wherein the analog-to-digital converter circuit comprises:
an analog input configured for receiving the analog input signal;
at least one sub-ADC connected to the analog input signal, wherein the at least one sub-ADC is configured to output at least one encoded output vector in response to receiving the analog input signal; and
a lookup circuit comprising a nested lookup table, wherein the lookup circuit comprises a first address logic block that is configured to generate a first coarse address and a first fine address in response to the lookup circuit receiving the at least one encoded output vector, wherein the lookup circuit is configured to select an output value from the nested lookup table using the at least one encoded output vector, the first coarse address, and the first fine address, and wherein the lookup circuit is configured to provide the output value as the digitization of the analog input signal.

2. The analog-to-digital converter circuit of claim 1, wherein:
the analog input signal is a differential analog input signal;
the analog input comprises a negative analog input and a positive analog input, wherein the negative analog input and the positive analog input are configured for receiving the differential analog input signal, wherein the at least one sub-ADC comprises a first sub-ADC and a second sub-ADC, wherein the first sub-ADC is connected to the positive analog input, wherein the first sub-ADC is configured to output a first encoded output vector in response to receiving the positive analog input of the differential analog input signal, wherein the second sub-ADC is connected to the negative analog input, wherein the second sub-ADC is configured to output a second encoded output vector in response to receiving the negative analog input of the differential analog input signal; and
the lookup circuit is a subtractor circuit comprising the nested lookup table, wherein the subtractor circuit is configured to select a subtractor value from the nested lookup table using the first encoded output vector and the second encoded output vector as the output value, wherein the subtractor circuit is configured to output the subtractor value as the digitization of the differential analog input signal.

3. The analog-to-digital converter circuit of claim 2, wherein the subtractor circuit comprises a second address logic block, wherein the second address logic block is configured to generate a second coarse address and a second fine address in response to the subtractor circuit receiving the second encoded output vector, wherein the subtractor circuit is configured to choose the subtractor value from the nested lookup table using the first coarse address, the second coarse address, the first fine address, and the second fine address.

4. The analog-to-digital converter circuit of claim 3, wherein the nested lookup table comprises a discrete number of fine lookup tables and a coarse look up table, wherein each entry of coarse lookup table comprises a selection of one of the discrete number of fine lookup tables, wherein each entry of the selection of one of the discrete number of fine lookup tables comprises the subtractor value, wherein the subtractor circuit is configured to choose the selection of one of the discrete number of fine lookup tables using the first coarse address and the second coarse address, wherein the subtractor circuit is configured to choose the final subtractor value from the one of the discrete number of fine lookup tables using the first fine address and the second fine address.

5. The analog-to-digital converter circuit of claim 4, wherein at least one of the discrete number of the fine lookup tables is selectable by more than one entry of the coarse lookup table, wherein the coarse lookup table is preferably arranged as a two dimensional array with the more than one entry of the coarse lookup table arranged along a diagonal of the array.

6. The analog-to-digital converter circuit of claim 3, wherein the first encoded output vector is a first thermometer encoded output vector, wherein the second encoded output vector is a second thermometer encoded output vector, wherein the subtractor circuit further comprises a first 1-hot encoder to convert the first thermometer encoded output vector into a first 1-hot encoded vector, wherein the second subtractor circuit further comprises a second 1-hot encoder to convert the second thermometer encoded output vector into a second 1-hot encoded vector, wherein the first address block is configured to output the first coarse address and the first fine address in response to receiving the first 1-hot encoded vector, wherein the second address block is configured to output the second coarse address and the second fine address in response to receiving the second 1-hot encoded vector.

7. The analog-to-digital converter circuit of claim 6, wherein the first coarse address and the first fine address are generated from the first 1-hot encoded vector using a first tri-stable device logic network, and wherein the second coarse address and the second fine address are generated from the second 1-hot encoded vector using a second tri-stable device logic network.

8. The analog-to-digital converter circuit of claim 1, wherein each of the at least one sub-ADC comprises:
a sampling capacitor;
a sampling switch for connecting the analog input to the sampling capacitor;
a voltage-to-time converter for converting a voltage of the sampling capacitor into a voltage ramp;
a pulse generator configured for converting the voltage ramp into a pulse signal; and
a plurality of sampling latches to generate first encoded output vector and second encoded output vector in response to receiving the pulse signal.

9. The analog-to-digital converter circuit of claim 8, wherein the analog-to-digital converter circuit comprises a centralized multiphase clock generator for generating multiphase clock signals for controlling the plurality of sampling latches.

10. The analog-to-digital converter circuit of claim 9, wherein each of the plurality of sampling latches has a clock input connected to the centralized multiphase clock generator, and wherein each of the plurality of sampling latches has a sampling input connected to a chosen signal provided by the voltage-to-time converter via a successive edge-to-pulse converter.

11. The analog-to-digital converter circuit of claim 9, wherein each of the plurality of sampling latches has a sampling input connected to a chosen signal provided by the voltage-to-time converter, and wherein each of the plurality of sampling latches has a clock input connected to the centralized multiphase clock generator.

12. The analog-to-digital converter circuit of claim 1, wherein each of the at least one sub-ADC comprises:
a sampling capacitor;
a sampling switch for connecting the analog input to the sampling capacitor;
a voltage-to-time converter for converting a voltage of the sampling capacitor into a voltage ramp;
a multiphase voltage-controlled-oscillator (VCO) configured to generate VCO pulses; and
an integer counter configured to generate first encoded output vector and second encoded output vector by counting the VCO pulses until the voltage ramp changes a binary state.

13. The analog-to-digital converter circuit of claim 1, wherein the at least one sub-ADC is multiple sub-ADCs, wherein the multiple sub-ADCs provide an interleaved data path.

14. The analog-to-digital converter circuit of claim 1, wherein the at least one sub-ADC is at least one time-based sub-ADC.

15. The analog-to-digital converter circuit of claim 2, wherein the nested lookup table comprises corrections for any one of the following: a bubbling correction, a non-linearity correction, and combinations thereof.

16. The analog-to-digital converter circuit of claim 1, wherein the nested lookup table encodes a subtractor value in 2 s complement format or in sign and magnitude format.

17. The analog-to-digital converter circuit of claim 1, wherein the at least one sub-ADC is a single sub-ADC, wherein the output value is an absolute value representing the analogue input in the digital domain.

18. The analog-to-digital converter circuit of claim 17, wherein the lookup circuit comprises an address logic block, wherein the address logic block is configured to generate a coarse address and a fine address in response to the lookup circuit receiving the encoded output vector, wherein the lookup circuit is configured to choose the output value from the nested lookup table using the coarse address and the fine address.

19. A digital sampling oscilloscope configured for receiving an input signal, wherein said digital sampling oscilloscope comprises:
a signal processing unit;
an analog-to-digital converter circuit connected to the signal processing unit;
a computational device connected to the analog-to-digital converter circuit;
a user interface connected to the computational device; and
a display connected to the computational device;
wherein the analog-to-digital converter circuit comprises:
an analog input configured for receiving the analog input signal;
at least one sub-ADC connected to the analog input signal, wherein the at least one sub-ADC is configured to output at least one encoded output vector in response to receiving the analog input signal; and
a lookup circuit comprising a nested lookup table, wherein the lookup circuit comprises a first address logic block that is configured to generate a first coarse address and a first fine address in response to the lookup circuit receiving the at least one encoded output vector, wherein the lookup circuit is configured to select an output value from the nested lookup table using the at least one encoded output vector, the first coarse address, and the first fine address, and wherein the lookup circuit is configured to provide the output value as the digitization of the analog input signal.

20. A telecommunications receiver circuit configured for receiving an input signal, wherein said telecommunications receiver circuit comprises:
a signal conditioning circuit;
an analog-to-digital converter circuit connected to the signal conditioning circuit; and
a digital signal processor connected to the analog-to-digital converter circuit;
wherein the analog-to-digital converter circuit comprises:
an analog input configured for receiving the analog input signal;
at least one sub-ADC connected to the analog input signal, wherein the at least one sub-ADC is configured to output at least one encoded output vector in response to receiving the analog input signal; and
a lookup circuit comprising a nested lookup table, wherein the lookup circuit is configured to select an output value from the nested lookup table using the at least one encoded output vector, wherein the lookup circuit is configured to provide the output value as the digitization of the analog input signal;
wherein:
the analog input signal is a differential analog input signal;
the analog input comprises a negative analog input and a positive analog input, wherein the negative analog input and the positive analog input are configured for receiving the differential analog input signal, wherein the at least one sub-ADC comprises a first sub-ADC and a second sub-ADC, wherein the first sub-ADC is connected to the positive analog input, wherein the first sub-ADC is configured to output a first encoded output vector in response to receiving the positive analog input of the differential analog input signal, wherein the second sub-ADC is connected to the negative analog input, wherein the second sub-ADC is configured to output a second encoded output vector in response to receiving the negative analog input of the differential analog input signal; and
the lookup circuit is a subtractor circuit comprising a nested lookup table, wherein the subtractor circuit is configured to select a subtractor value from the nested lookup table using the first encoded output vector and the second encoded output vector as the output value, wherein the subtractor circuit is configured to output the subtractor value as the digitization of the differential analog input signal.

* * * * *